United States Patent
Kim et al.

(10) Patent No.: US 10,803,792 B2
(45) Date of Patent: Oct. 13, 2020

(54) DISPLAY DEVICE INCLUDING A FLEXIBLE DISPLAY PANEL AND GROUPS OF SIGNAL LINES SEPARATED BY A PLURALITY OF INTERVALS

(71) Applicant: SAMSUNG DISPLAY CO., LTD., Yongin-Si, Gyeonggi-Do (KR)

(72) Inventors: Kwang-Min Kim, Seoul (KR); Won Kyu Kwak, Seongnam-si (KR); Sun-Ja Kwon, Gunpo-si (KR); Byung Sun Kim, Hwaseong-si (KR); Hye Jin Shin, Cheonan-si (KR); Dong-Hyun Lee, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 160 days.

(21) Appl. No.: 15/337,185

(22) Filed: Oct. 28, 2016

(65) Prior Publication Data

US 2017/0287394 A1    Oct. 5, 2017

(30) Foreign Application Priority Data

Mar. 31, 2016    (KR) ........................ 10-2016-0039387

(51) Int. Cl.
*G06F 1/16*    (2006.01)
*G09G 3/3225*    (2016.01)
(Continued)

(52) U.S. Cl.
CPC ......... *G09G 3/3225* (2013.01); *G06F 1/1652* (2013.01); *G09G 3/3266* (2013.01);
(Continued)

(58) Field of Classification Search
CPC .......... G06F 1/1652; G09G 2300/0426; G09G 2310/0202; G09G 2310/0232;
(Continued)

(56) References Cited

U.S. PATENT DOCUMENTS 6,407,729 B1 *  6/2002  Moon ................. G09G 3/3648
                                                        345/205
8,253,320 B2 *  8/2012  Nakanishi ............ G02F 1/1345
                                                        313/483
(Continued)

FOREIGN PATENT DOCUMENTS

JP    11-212540    8/1999
JP    2008-249977    10/2008
(Continued)

OTHER PUBLICATIONS

Extended European Search Report dated Jul. 13, 2017 in corresponding European Patent Application No. 17164270.5.
(Continued)

*Primary Examiner* — Ram A Mistry
(74) *Attorney, Agent, or Firm* — F. Chau & Associates, LLC

(57) ABSTRACT

A display device includes a display panel that includes a display area and a first peripheral area adjacent to the display area. The first peripheral area includes a bendable region extending across the display panel and a plurality of signal lines partially included in the bendable region. The plurality of signal lines includes a first and second group adjacent to each other in the bendable region. The first group includes two or more first signal lines that transmit signals of a first polarity. The second group includes two or more second signal lines that transmit signals of a second polarity different from the first polarity. The first and second group are separated by a first interval, and signal lines within the first or second group are separated by a second interval. The first interval is greater than the second interval.

28 Claims, 14 Drawing Sheets

(51) Int. Cl.
*H01L 27/32* (2006.01)
*H01L 51/00* (2006.01)
*G09G 3/3266* (2016.01)
*H01L 27/12* (2006.01)

(52) U.S. Cl.
CPC ...... *H01L 27/3276* (2013.01); *H01L 51/0097* (2013.01); *G09G 2300/0426* (2013.01); *G09G 2310/0202* (2013.01); *G09G 2310/0232* (2013.01); *G09G 2310/0254* (2013.01); *G09G 2310/08* (2013.01); *G09G 2320/0219* (2013.01); *G09G 2330/028* (2013.01); *G09G 2380/02* (2013.01); *H01L 27/1218* (2013.01); *H01L 27/1244* (2013.01); *H01L 2251/5338* (2013.01); *Y02E 10/549* (2013.01)

(58) Field of Classification Search
CPC ....... G09G 2310/0254; G09G 2310/08; G09G 2320/0219; G09G 2330/028; G09G 3/3225; G09G 3/3266; H01L 2251/5338; H01L 27/1244; H01L 27/3276; H01L 51/0097; Y02E 10/549
See application file for complete search history.

(56) References Cited

U.S. PATENT DOCUMENTS

| | | |
|---|---|---|
| 2008/0137021 A1* | 6/2008 | Choi .............. G02F 1/1345 349/150 |
| 2008/0238866 A1 | 10/2008 | Saito |
| 2013/0002583 A1* | 1/2013 | Jin ................ G06F 1/1637 345/173 |
| 2013/0093658 A1 | 4/2013 | Park et al. |
| 2014/0240985 A1 | 8/2014 | Kim et al. |
| 2014/0254111 A1 | 9/2014 | Yamazaki et al. |
| 2014/0299884 A1 | 10/2014 | Park et al. |
| 2016/0035759 A1 | 2/2016 | Kwon et al. |

FOREIGN PATENT DOCUMENTS

| | | |
|---|---|---|
| KR | 1020080044503 | 5/2008 |
| KR | 10-0961268 | 5/2010 |
| KR | 1020140045192 | 4/2014 |

OTHER PUBLICATIONS

2nd OA dated Sep. 10, 2019 in corresponding Application No. JP 2015-145651.
Extended European Search Report dated Jul. 10, 2019 in corresponding European Patent Application No. 19165416.9.

\* cited by examiner (a)

DISPLAY DEVICE INCLUDING A FLEXIBLE DISPLAY PANEL AND GROUPS OF SIGNAL LINES SEPARATED BY A PLURALITY OF INTERVALS

CROSS-REFERENCE TO RELATED APPLICATION

This application claims priority under 35 U.S.C. § 119 to Korean Patent Application No. 10-2016-0039387, filed in the Korean Intellectual Property Office on Mar. 31, 2016, the disclosure of which is incorporated by reference herein in its entirety.

TECHNICAL FIELD

The disclosure relates to a display device. More particularly, the disclosure relates to a display device including a flexible substrate.

DISCUSSION OF RELATED ART

A display device, such as a liquid crystal display (LCD), an organic light emitting diode (OLED) display, etc., includes a display panel with a plurality of pixels that can display an image. Each pixel includes a pixel electrode for receiving a data signal, and the pixel electrode is connected to at least one transistor to receive the data signal.

The transistor includes a control electrode, an input electrode, an output electrode, and a semiconductor layer connected to the input electrode and the output electrode. The transistor is connected to a plurality of signal lines to receive signals. The plurality of signal lines includes a gate line for transmitting a gate signal, a data line for transmitting a data voltage, and the like. The transistor may be disposed on a substrate of a display panel together with various signal lines through a semiconductor manufacturing process.

Various signals and voltages required to drive the display panel may be received from a circuit film on which a driving circuit chip is mounted. The driving circuit chip may be connected to the display panel. The signal lines in the display panel may be disposed in the display area or in a peripheral area of the display area. Particularly, a plurality of signal lines disposed in the peripheral area may be connected to the driving circuit chip or film to transmit the required signals.

The signal lines may be formed of at least one conductive layer disposed on the substrate. Insulating layers are disposed between conductive layers disposed on different layers on the substrate. The insulating layers may include an inorganic insulating material or an organic insulating material.

Recently, a display panel has been actively developed using a flexible substrate which is light and bendable instead of a substrate having a heavy and rigid form. The flexible substrate may be an insulation substrate.

At least one portion of the display panel including the flexible substrate may be bent or curved. For example, while the display device is manufactured, the peripheral area of the display panel in which an image is not displayed is bent and hidden in a rear side of the display panel, reducing the size of a bezel region of the display device. The region of the display panel that is bent may be referred to as a bent region or a bending region.

SUMMARY

An exemplary embodiment of the inventive concept provides a display device including a display panel that includes a display area including a plurality of pixels and a first peripheral area adjacent to the display area. The first peripheral area may include a bendable region extending across the display panel and a plurality of signal lines partially included in the bendable region. The plurality of signal lines may include a first group and a second group that are adjacent to each other in the bendable region. The first group may include two or more first signal lines among the plurality of signal lines. The second group may include two or more second signal lines among the plurality of signal lines. The two or more first signal lines included in the first group may transmit signals of a same first polarity. The two or more second signal lines included in the second group may transmit signals of a second polarity that is opposite to the first polarity. The first group and the second group may be separated by a first interval and signal lines within the first group or the second group may be separated by a second interval. The first interval may be greater than the second interval.

The plurality of signal lines may further include a third group adjacent to the first group or the second group in the bendable region. The third group may include two or more third signal lines among the plurality of signal lines. The two or more third signal lines included in the third group may transmit signals having polarities that vary according to time.

Signal lines within the third group may be separated by a third interval. The third interval may be greater than the second interval.

The first interval may be greater than the third interval.

Two or more signal lines, among the plurality of signal lines, adjacent to each other and disposed at an edge of at least one group among the first group, the second group, and the third group may be connected to one another.

The plurality of signal lines may extend in a direction different from an extension direction of the bendable region. The display panel may further include a second peripheral area and a third peripheral area that are each connected to the first peripheral area and adjacent to the display area. The second peripheral area and the third peripheral area may be opposite other with respect to the display area. At least one signal line, among the first signal lines included in the first group, the second signal lines included in the second group, and the third signal lines included in the third group, may include a portion extending into the second peripheral area in a direction different from the extension direction of the bendable region.

At least one signal line among the two or more third signal lines included in the third group may be disposed only in the first peripheral area, and may include a portion substantially parallel to the extension direction of the bendable region.

The first peripheral area may include a transistor connected to the at least one signal line among the two or more third signal lines disposed only in the first peripheral area.

The display area may include a plurality of data lines and a plurality of gate lines that are connected to the plurality of pixels. The second peripheral area may include a gate driver for transmitting a gate signal to the plurality of gate lines. The at least one signal line, among the first signal lines, the second signal lines, and the third signal lines, that include the portion extending into the second peripheral area in the direction different from the extension direction of the bendable region may be connected to the gate driver.

The display panel may further include a fourth peripheral area that is connected to both the second peripheral area and the third peripheral area, and is adjacent to the display area. The fourth peripheral area and the first peripheral area may be opposite each other with respect to the display area. At least one signal line, among the first signal lines included in the first group and the second signal lines included in the second group, may include a portion extending into the fourth peripheral area in a direction substantially parallel to the extension direction of the bendable region.

The fourth peripheral area may include a transistor connected to the at least one signal line among the first signal lines and the second signal lines that extend into the fourth peripheral area.

Two or more signal lines, among the plurality of signal lines, adjacent to each other and disposed at an edge of at least one group among the first group and the second group may be connected to one another.

The plurality of signal lines extend in a direction different from an extension direction of the bendable region. The plurality of signal lines may include a data signal line group for transmitting data signals and a third group adjacent to the first group or the second group in the bendable region. The first group, the second group, and the third group may be disposed between an edge of the bendable region and the data signal line group. The data signal line group may be disposed substantially at a central portion of the bendable region among the plurality of signal lines, along the extension direction of the bendable region.

The plurality of signal lines may include a first additional group, a second additional group, and a third additional group that are disposed opposite to the first group, the second group, and the third group, respectively, with respect to the data signal line group. The first additional group, the second additional group, and the third additional group may each include at least one of the plurality of signal lines. The signal lines included in the first additional group may transmit signals of the first polarity. The signal lines included in the second additional group may transmit signals of the second polarity. The signal lines included in the third additional group may transmit signals having a polarity that varies according to time.

The plurality of signal lines may include a data signal line group for transmitting data signals, and a third group, a fourth group, and a fifth group that are adjacent to the first group or the second group in the bendable region. The first group, the second group, and the third group may be disposed between an edge of the bendable region and the data signal line group. The fourth group and the fifth group may be disposed between the data signal line group and a group among the first group, the second group, and the third group that is nearest to the data signal line group. The fourth group and the fifth group may include at least one of the plurality of signal lines. The fourth group and the fifth group may transmit a signal of a constant polarity.

The signal line included in the fourth group may transmit a constant voltage having negative polarity. The signal line included in the fifth group may transmit a constant voltage having positive polarity.

The display panel may further include a second peripheral area and a third peripheral area that are each connected to the first peripheral area and are adjacent to the display area, and a fourth peripheral area that is connected to both the second peripheral area and the third peripheral area and is adjacent to the display area. The first peripheral area and the fourth peripheral area may be opposite each other with respect to the display area. The second peripheral area and the third peripheral area may be opposite each other with respect to the display area. The signal line included in the fourth group may include portions disposed in the second peripheral area, the third peripheral area, and the fourth peripheral area.

The signal line included in the fifth group may be connected to a driving voltage transmitting line disposed between the first peripheral area and the display area. The display area may include a plurality of driving voltage lines connected to the driving voltage transmitting line.

The display device may further include an insulating layer adjacent to the plurality of signal lines disposed in the bendable region. The insulating layer may contain an organic insulating material, and the display panel may be bendable in the bendable region.

An exemplary embodiment of the inventive concept provides a display device including a display panel that includes a display area including a plurality of pixels and a first peripheral area adjacent to the display area. The first peripheral area may include a bendable region extending across the display panel and a plurality of signal lines partially included in the bendable region. The plurality of signal lines may extend in a direction different from an extension direction of the bendable region. The plurality of signal lines may include a data signal line group for transmitting data signals, and a first group, a second group, and a third group that are disposed between an edge of the bendable region and the data signal line group and are adjacent to each other in the bendable region. The data signal line group, the first group, the second group, and the third group may each include at least one of the plurality of signal lines. The signal lines included in the first group may transmit a signal of positive polarity. The signal lines included in the second group may transmit a signal of negative polarity. The signal lines included in the third group may transmit signals having a polarity that varies according to time. One group among the first group, the second group, and the third group may include a signal line among the plurality of signal lines disposed at an edge of the bendable region.

The first group may include two or more adjacent signal lines among the plurality of signal lines. The first group and the second group are separated by a first interval and signal lines within the first group may be separated by a second interval. The first interval may be greater than the second interval.

Signal lines within the third group may be separated by a third interval. The third interval may be greater than the second interval.

An exemplary embodiment of the inventive concept provides a display device including a display panel that includes a display area including a plurality of pixels and a first peripheral area adjacent to the display area. The first peripheral area may include a bendable region and a plurality of signal pads. The plurality of signal pads are connected to a plurality of electrical nodes in the display area by a plurality of signal lines through the bendable region. The plurality of signal lines includes a first group of first signal lines disposed adjacent to each other and configured to transmit signals at a first polarity and a second group of second signal lines disposed adjacent to each other and configured to transmit signals at a second polarity, where the second polarity is different from the first polarity. The first signal lines of the first group are separated from each other by a first interval, the second signal lines of the second group are separated from each other by a second interval, and the first group is separated from the second group by a third interval. The third interval is greater than the first interval or the second interval.

The plurality of signal lines may further include a third group of third signal lines disposed adjacent to each other and configured to transmit signals at varying polarities depending on time. The third signal lines of the third group are separated from each other by a fourth interval and the fourth interval is greater than the first interval or the second interval.

The bendable region may include an organic insulating material.

The plurality of signal lines may further include a data signal line group for transmitting data signals, a fourth group of fourth signal lines, and a fifth group of fifth signal lines. The first group, the second group, the third group, the fourth group, and the fifth group are disposed sequentially in that order from an edge of the bendable region to the data signal line group and are adjacent to one another in the bendable region. The data signal line group is disposed substantially at a central portion of the bendable region along an extension direction of the bendable region. The fifth signal lines transmit signals at the first polarity. The fourth signal lines transmit signals at the second polarity. The second group and the third group are separated by a fifth interval. The third group and the data signal line group are separated by a sixth interval. The fifth interval and the sixth interval are greater than the first interval, the second interval, and the fourth interval. The fourth signal lines in the fourth group and the fifth signal lines in the fifth group are separated from each other by a seventh interval and an eight interval, respectively. The fourth group and the fifth group are separated by a ninth interval. The seventh interval and the eight interval are smaller than the ninth interval.

The display panel may further include a second peripheral area and a third peripheral area that are each connected to the first peripheral area and are adjacent to the display area, and a fourth peripheral area that is connected to both the second peripheral area and the third peripheral area and is adjacent to the display area. The first peripheral area and the fourth peripheral area are opposite each other with respect to the display area. The second peripheral area and the third peripheral area are opposite each other with respect to the display area. The first signal lines of the first group and the second signal lines of the second group extend out of the first peripheral area and along the second peripheral area, the fourth peripheral area, and the third peripheral area to substantially surround the display area.

The display panel may further include a second peripheral area and a third peripheral area that are each connected to the first peripheral area and are adjacent to the display area, a fourth peripheral area that is connected to both the second peripheral area and the third peripheral area and is adjacent to the display area, and a data input circuit portion disposed between the bendable region and the display area. The first peripheral area and the fourth peripheral area are opposite each other with respect to the display area. The second peripheral area and the third peripheral area are opposite each other with respect to the display area. A portion of the third signal lines of the third group extend out of the first peripheral area and along the second peripheral area. A portion of the third signal lines of the third group extend out of the bendable region to partially surround the data input circuit portion.

The display panel may further include a second peripheral area and a third peripheral area that are each connected to the first peripheral area and are adjacent to the display area, and a fourth peripheral area that is connected to both the second peripheral area and the third peripheral area and is adjacent to the display area. The first peripheral area and the fourth peripheral area are opposite each other with respect to the display area. The second peripheral area and the third peripheral area are opposite each other with respect to the display area. The fourth signal lines of the fourth group extend out of the first peripheral area and along the second peripheral area, the fourth peripheral area, and the third peripheral area to substantially surround the display area. The fifth signal lines of the fifth group extend out of the bendable region towards the display area to connect to a driving voltage transmitting line extending along an edge of the display area adjacent to the first peripheral area.

Two or more signal lines, among the plurality of signal lines, adjacent to each other and disposed at an edge of at least one group among the first group, the second group, and the third group are connected to one another.

DETAILED DESCRIPTION OF THE EMBODIMENTS

Figure 1:
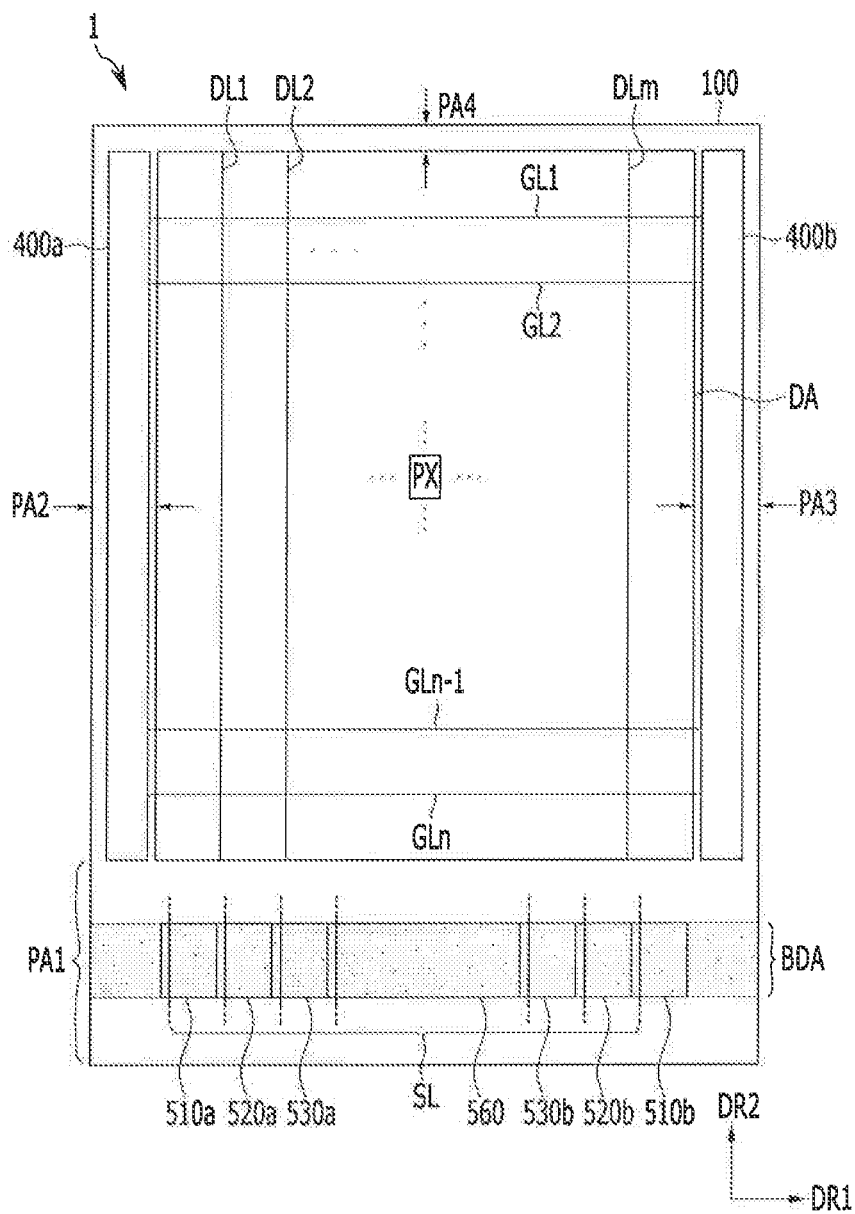
FIG. 1 illustrates a schematic layout view of a display panel included in a display device before the display panel is bent, according to an exemplary embodiment of the inventive concept.

Exemplary embodiments of the inventive concept will be described more fully hereinafter with reference to the accompanying drawings. Like reference numerals may refer to like elements throughout the accompanying drawings.

Further, in the drawings, the size and thickness of each element are illustrated for ease of description, and embodiments of the inventive concept are not necessarily limited to those illustrated in the drawings. The thickness of layers, films, panels, regions, etc., may be exaggerated for clarity.

It will be understood that when an element such as a layer, film, region, or substrate is referred to as being "on" another element, it can be directly on the other element or intervening elements may also be present. Further, in the specification, the word "on" or "above" means positioned on or below the object portion, and does not necessarily mean positioned on the upper side of the object portion with respect to a gravitational direction.

Exemplary embodiments of the inventive concept provide a display device with a flexible display panel that may delay and reduce corrosion occurring at signal lines disposed in a bending region of the display device.

Figure 2:
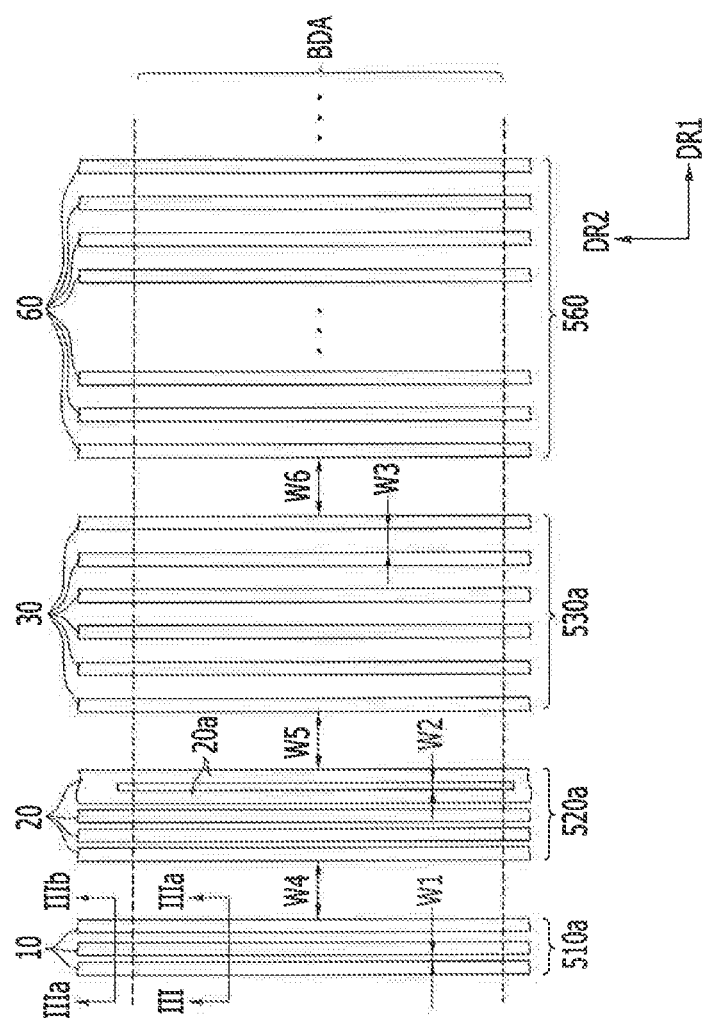
FIG. 2 illustrates a layout view of a plurality of signal lines disposed in a bending region of the display panel shown in FIG. 1 according to an exemplary embodiment of the inventive concept.
Figure 3A:
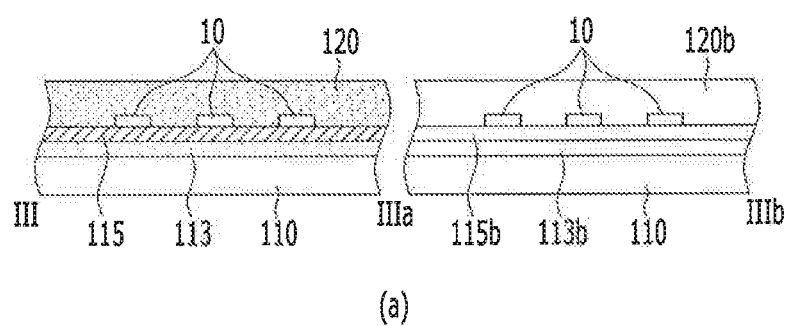
FIG. 3A, FIG. 3B, and FIG. 3C illustrate cross-sectional views taken along lines III-IIIa-IIIb of the display panel shown in FIG. 2, according to exemplary embodiments of the inventive concept.
Figure 3B:
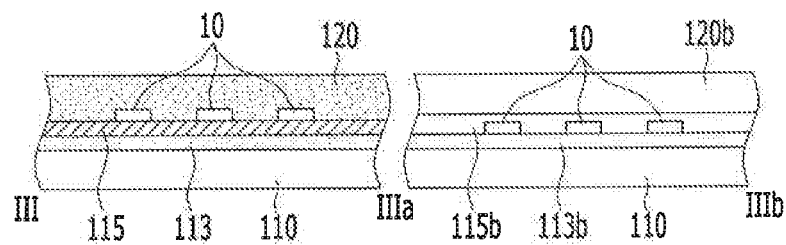
Figure 3C:
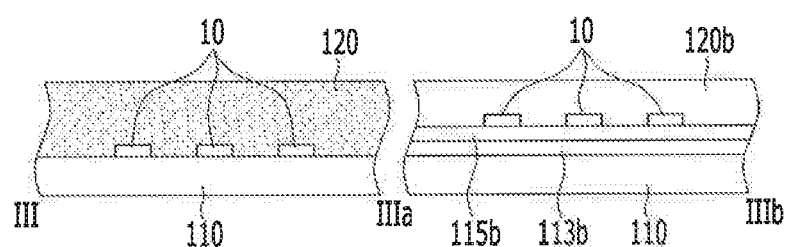
Figure 4:
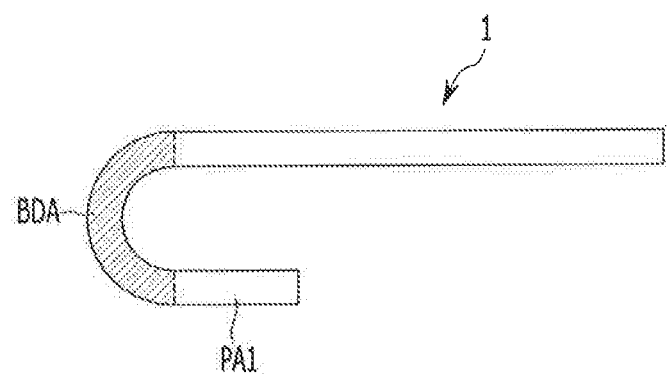
FIG. 4 illustrates a schematic view of a state in which a display panel of a display device is bent in a bending region according to an exemplary embodiment of the inventive concept.

FIG. 1 illustrates a schematic layout view of a display panel included in a display device before the display panel is bent according to an exemplary embodiment of the inventive concept. FIG. 2 illustrates a layout view of a plurality of signal lines disposed in a bending region of the display panel shown in FIG. 1, according to an exemplary embodiment of the inventive concept. FIG. 3A, FIG. 3B, and FIG. 3C illustrate cross-sectional views taken along lines III-IIIa-IIIb of the display panel shown in FIG. 2, according to an exemplary embodiment of the inventive concept. FIG. 4 illustrates a schematic view of a state in which a display panel of a display device is bent in a bending region according to an exemplary embodiment of the inventive concept.

According to an exemplary embodiment of the inventive concept, a display device 1 includes a display panel 100. The display panel 100 includes a display area (DA) for displaying an image, and peripheral areas (PA1, PA2, PA3, and PA4) disposed at a periphery of the display area (DA). At least one portion of the display panel 100 may be bendable or flexible.

When the display panel 100 is not bent and is in a flat state, a first direction (DR1) and a second direction (DR2) shown in FIG. 1 are directions with respect to a display surface of the display panel 100 when viewed from a direction perpendicular to the display surface. The first direction (DR1) and the second direction (DR2) are perpendicular to each other.

The display area (DA) includes a plurality of pixels (PX) for displaying images and a plurality of display signal lines.

Each pixel (PX) is a unit that displays an image, and can display light with luminance corresponding to input image signals. Each pixel (PX) may emit one of the primary colors such as red, green, or blue.

The plurality of display signal lines disposed in the display area (DA) includes a plurality of gate lines (GL1, GL2, . . . , and GLn) and a plurality of data lines (DL1, DL2, and DLm).

The plurality of gate lines (GL1, GL2, . . . , and GLn) may be sequentially arranged along the second direction (DR2), and each gate line (GL1, GL2, . . . , or GLn) may substantially extend in the first direction (DR1). The gate lines (GL1, GL2, . . . , and GLn) may transmit gate signals for turning on or turning off transistors disposed in the display area (DA).

The plurality of data lines (DL1, DL2, . . . , and DLm) may be sequentially arranged along the first direction (DR1), and each data line (DL1, DL2, . . . , or DLm) may substantially extend in the second direction (DR2). The data lines (DL1, DL2, . . . , and DLm) may transmit data signals associated with the input image signals.

The peripheral areas (PA1, PA2, PA3, and PA4) are adjacent to the display area (DA), and are on the periphery of the display area (DA). In FIG. 1, a first peripheral area (PA1), a second peripheral area (PA2) connected to the first peripheral area (PA1), a third peripheral area (PA3) connected to the first peripheral area (PA1) and facing the second peripheral area (PA2) with the display area (DA) therebetween, and a fourth peripheral area (PA4) facing the first peripheral area (PA1) with the display area (DA) therebetween may be disposed at the sides of the display area (DA). The peripheral areas (PA1, PA2, PA3, and PA4) may surround the periphery of the display area (DA). When the display panel 100 is flat, the first peripheral area (PA1) may have the widest area of the peripheral areas (PA1, PA2, PA3, and PA4). The first peripheral area (PA1) may be adjacent to the display area (DA) in the second direction (DR2).

A gate driver 400a may be positioned in the second peripheral area (PA2), and a gate driver 400b may be positioned in the third peripheral area (PA3). The gate drivers 400a and 400b may include circuits that transmit the gate signals to the plurality of gate lines (GL1, GL2, . . . , and GLn). The circuits of the gate drivers 400a and 400b may be disposed in the display panel 100 together with the plurality of display signal lines and transistors disposed in the display area (DA).

One of the gate lines (GL1, GL2, . . . , and GLn) may be connected to both the gate driver 400a and the gate driver 400b to receive the gate signals, or it may be connected to one of the gate driver 400a or the gate driver 400b to receive the gate signals. In an alternative embodiment, one of the gate driver 400a or the gate driver 400b may be omitted.

The first peripheral area (PA1) may include a bending region (BDA).

The bending region (BDA) is a region that may continuously extend between left and right sides of the display panel 100, and across the display panel 100. In FIG. 1, the bending region (BDA) is illustrated as a region that continuously extends between the left side and right side of the display panel 100. The bending region (BDA) may extend across the display panel 100 in a direction, e.g., the first direction (DR1), different from the second direction (DR2).

Referring to FIG. 4, by bending the display panel 100 in the bending region (BDA), the bending region (BDA) and a portion of the first peripheral area (PA1) disposed at the outside of the bending region (BDA) may be bent and hidden in a rear direction of the display area (DA).

Referring to FIG. 1, a plurality of signal lines (SL) are disposed in the peripheral areas (PA1, PA2, PA3, and PA4), and are partially disposed in the bending region (BDA). The plurality of signal lines (SL) disposed within the bending region (BDA) include a data signal line group 560, a first group 510a, a second group 520a, and a third group 530a. The plurality of signal lines (SL) disposed within the bending region (BDA) are arranged to be substantially spaced apart from each other in the first direction (DR1), and may substantially extend in the second direction (DR2) in the bending region (BDA).

Referring to FIG. 1 and FIG. 2, the data signal line group 560 includes a plurality of data signal lines 60 for transmitting data signals to the data lines (DL1, DL2, . . . , and DLm). The plurality of data signal lines 60 may extend to be substantially parallel to each other in the bending region (BDA), and may extend in a direction substantially parallel to the second direction (DR2). Referring to FIG. 1, the data signal line group 560 may be disposed substantially in a central portion of the bending region (BDA) with respect to the first direction (DR1).

The first group 510a, the second group 520a, and the third group 530a are adjacent to each other in the bending region (BDA), and may be disposed between a left edge of the display panel 100 and the data signal line group 560. One of the first group 510a, the second group 520a, and the third group 530a may be disposed at an outermost edge of the bending region (BDA) such that it includes a signal line SL disposed at an outermost edge of the plurality of signal lines (SL) included in the bending region (BDA). Another of the first group 510a, the second group 520a, and the third group 530a may be adjacent to the group disposed at the outermost edge of the bending region (BDA). The remaining of the first group 510a, the second group 520a, and the third group 530a may be disposed to be closest to the data signal line group 560. In other words, the first group 510a, the second group 520a, and the third group 530a may be arranged in any order in the bending region (BDA). In FIG. 1 and FIG. 2, it is exemplarily illustrated that the first group 510a includes outermost edge portions of the plurality of signal lines (SL) partially disposed in the bending region (BDA), the second group 520a is adjacent to the first group 510a, and the third group 530a is disposed between the second group 520a and the data signal line group 560.

Referring to FIG. 2, the first group 510a includes a plurality of first signal lines 10, the second group 520a includes a plurality of second signal lines 20, and the third group 530a includes a plurality of third signal lines 30.

The plurality of first signal lines 10 may extend to be substantially parallel to each other in the bending region (BDA), the plurality of second signal lines 20 may extend to be substantially parallel to each other in the bending region (BDA), and the plurality of third signal lines 30 may extend to be substantially parallel to each other in the bending region (BDA). The first signal lines 10, second signal lines 20, and third signal lines 30 may substantially extend in the second direction (DR2) in the bending region (BDA).

The first signal lines 10, second signal lines 20, third signal lines 30, and data signal lines 60 may be collectively referred to as signal lines, for ease of description.

Referring to FIG. 2, FIG. 3A, FIG. 3B, and FIG. 3C, the display panel 100 includes a substrate 110, as illustrated in the cross-sectional views of FIGS. 3A to 3C. The substrate 110 includes an insulating material and is flexible. For example, the substrate 110 may include a plastic material such as polyimide, polyamide, etc.

The signal lines 10, 20, 30, and 60 are disposed on the substrate 110. The signal lines 10, 20, 30, and 60 may include a conductive material such as copper, aluminum, etc. Particularly, the signal lines 10, 20, 30, and 60 disposed within the bending region (BDA) may include a conductive material having excellent flexibility so that they may be easily bent. For example, the signal lines 10, 20, 30, and 60 disposed within the bending region (BDA) may include aluminum.

Referring to FIG. 2 and FIG. 3A, at least one of lower insulating layers 113 and 115 may be disposed between the substrate 110 and the signal lines 10, 20, 30, and 60 in the bending region (BDA), and at least one of lower insulating layers 113b and 115b may be disposed between the substrate 110 and the signal lines 10, 20, 30, and 60 in a region other than the bending region (BDA). In FIG. 3A, the lower insulating layers 113 and 115 may be a first lower insulating layer 113 and a second lower insulating layer 115 in the bending region (BDA), and the lower insulating layers 113b and 115b may be a first lower insulating layer 113b and a second lower insulating layer 115b in the region other than the bending region (BDA). In an alternative embodiment of the inventive concept, one of the lower insulating layers 113 and 115 may be omitted, and/or one of the lower insulating layers 113b and 115b may be omitted.

The layer position of the signal lines 10, 20, 30, and 60 in the bending region (BDA) and the layer position of the signal lines 10, 20, 30, and 60 in the region other than the bending region (BDA) may be substantially the same, or may be different.

At least one upper insulating layer 120 is disposed on the signal lines 10, 20, 30, and 60 in the bending region (BDA), and at least one upper insulating layer 120b is disposed on the signal lines 10, 20, 30, and 60 in the region other than the bending region (BDA).

The first and second lower insulating layers 113 and 115 and the upper insulating layer 120 that are disposed in the bending region (BDA) may include a highly flexible insulating material to prevent cracks from occurring and to be easily bent. For example, the first and second lower insulating layers 113 and 115 and the upper insulating layer 120 that are disposed in the bending region (BDA) may include an organic insulating material.

The first and second lower insulating layers 113b and 115b and the upper insulating layer 120b that are disposed in the region other than the bending region (BDA) may include an organic or inorganic insulating material, and at least one of the first and second lower insulating layers 113b and 115b and the upper insulating layer 120b may be an inorganic insulating layer containing an inorganic insulating material. The inorganic insulating layer is removed in the bending region (BDA) to prevent cracks from occurring therein and cracks being propagated while the bending region (BDA) is bent. In a portion of the bending region (BDA) in which the inorganic insulating layer is removed, the first lower insulating layer 113, the second lower insulating layer 115, or the upper insulating layer 120, which contain the organic insulating material as described above, may be disposed.

Referring to FIG. 2 and FIG. 3B, although the exemplary embodiment shown in FIG. 3B is mostly the same as the exemplary embodiment shown in FIG. 3A, there may be differences in the layer position of the signal lines 10, 20, 30, and 60 of the bending region (BDA) and the layer position of the signal lines 10, 20, 30, and 60 of the region other than the bending region (BDA). For example, the signal lines 10, 20, 30, and 60 of the region other than the bending region (BDA) may be disposed between the second lower insulating layer 115b and the substrate 110, and between the first lower insulating layer 113b and the second lower insulating layer 115b.

According to an exemplary embodiment of the inventive concept, the layer position of the signal lines 10, 20, 30, and 60 of the bending region (BDA) and the layer position of the signal lines 10, 20, 30, and 60 of the region other than the bending region (BDA) that are shown in FIG. 3B may be reversed.

Referring to FIG. 2 and FIG. 3C, although the exemplary embodiment shown in FIG. 3C is mostly the same as the exemplary embodiment shown in FIG. 3A, at least one of the first and second lower insulating layers 113 and 115 of the bending region (BDA) may be omitted. In FIG. 3C, it is exemplarily illustrated that both the first and second lower insulating layers 113 and 115 are omitted.

The plurality of signal lines 10, 20, 30, and 60 disposed in the bending region (BDA) may further include an extension portion extending to the outside of the bending region (BDA), and the extension portion may be disposed on the same layer as the signal lines 10, 20, 30, and 60 disposed in the bending region (BDA) or on another layer.

All of the first signal lines 10 of the first group 510a transmit signals of a first polarity, all of the second signal lines 20 of the second group 520a transmit signals of a second polarity, and all of the third signal lines 30 of the third group 530a transmit signals of a third polarity. The polarity of the signals includes positive (+) polarity and negative (−) polarity. The positive (+) polarity is one when a voltage level of the signal is greater than a reference voltage such as a ground voltage, and the negative (−) polarity is one when the voltage level of the signal is less than the reference voltage.

The first polarity, the second polarity, and the third polarity may be different, in that the polarities of the signals and change characteristics of the polarities are different from each other. For example, the signal of the first polarity has the positive (+) polarity and may be a signal of a constant polarity regardless of time, the signal of the second polarity has the negative (−) polarity and may be a signal of a constant polarity regardless of time, and the signal of the third polarity may be a signal having a polarity that varies according to time and may periodically or non-periodically swing between the positive (+) polarity and the negative (−) polarity. The signal of the first polarity and the signal of the second polarity may be signals of constant voltage, and the signal of the third polarity may be a signal having periodic pulses, e.g., clock signals.

At least one of the first signal lines 10 of the first group 510a, at least one of the second signal lines 20 of the second group 520a, and at least one of the third signal lines 30 of the third group 530a may be connected to the gate drivers 400a and 400b to transmit signals to the gate drivers 400a and 400b.

According to an exemplary embodiment of the inventive concept, the signal lines 10, 20, and 30 included in each of the first group 510a, the second group 520a, and the third group 530a may be dummy wires that do not transmit a signal.

According to an exemplary embodiment of the inventive concept, a signal line for transmitting a signal is not disposed between the first group 510a and the second group 520a adjacent to each other in the bending region (BDA), and a signal line for transmitting a signal is not disposed between the second group 520a and the third group 530a adjacent to each other. Signal lines may be disposed between the third group 530a and the data signal line group 560.

According to an exemplary embodiment of the inventive concept, when the signal lines 10, 20, and 30 for transmitting signals of the same polarity are disposed together, a voltage difference between signals transmitted by the signal lines 10, 20, and 30 in the groups 510a, 520a, and 530a, respectively, may be minimized, and a case in which the signal lines 10, 20, and 30 for transmitting signals of different polarities are adjacent to each other may be avoided.

If the signal lines for transmitting signals of the first polarity (e.g., the positive (+) polarity) and the signal lines for transmitting signals of the second polarity (e.g., the negative (−) polarity) are disposed closer to each other, the voltage difference of the signals transmitted by adjacent signal lines may create an undesirably large electric field, which in turn may corrode the signal lines. In other words, a strong electric field may occur between the adjacent signal lines 10, 20, and 30, such that charges may move between the adjacent signal lines 10, 20, and 30. When the organic insulating material is included in the lower and upper insulating layers 115 and 120 adjacent to the signal lines 10, 20, and 30 disposed in the bending region (BDA), since the organic insulating material has higher moisture permeability than inorganic insulating material, moisture and electrolytes may permeate into the signal lines 10, 20, and 30. When the electrolytes permeate into the signal lines 10, 20, and 30 of the bending region (BDA), corrosion may occur at the signal lines 10, 20, and 30, and when the strong electric field is generated between the adjacent signal lines 10, 20, and 30, corrosion may develop at the signal lines 10, 20, and 30 by the moving charges. Such corrosion may develop when the signal lines 10, 20, and 30 are made of a metal such as aluminum and the like.

According to an exemplary embodiment of the inventive concept, the signal lines for transmitting signals of the same polarity are disposed in close proximity to each other to minimize the voltage difference and the electric field between signals transmitted by the adjacent signal lines 10, 20, and 30 in the groups 510a, 520a, and 530a, respectively. Accordingly, corrosion occurring at the signal lines 10, 20, and 30 disposed in the bending region (BDA) is avoided or minimized.

Hereinafter, an interval is defined as the distance between adjacent signal lines measured in parallel with respect to the first direction (DR1). Referring to FIG. 2, an interval W1 between adjacent first signal lines 10 of the first group 510a may be constant, but is not limited thereto. When the interval W1 between the adjacent first signal lines 10 of the first group 510a is not constant, the interval W1 may correspond to an average distance between the adjacent first signal lines 10 of the first group 510a.

An interval W2 between adjacent second signal lines 20 of the second group 520a may be constant, but is not limited thereto. When the interval W2 between the adjacent second signal lines 20 of the second group 520a is not constant, the interval W2 may correspond to an average distance between the adjacent second signal lines 20 of the second group 520a.

The interval W1 between the adjacent first signal lines 10 may be similar to the interval W2 between the adjacent second signal lines 20.

An interval W3 between adjacent third signal lines 30 of the third group 530a may be constant, but is not limited thereto. When the interval W3 between the adjacent third signal lines 30 of the third group 530a is not constant, the interval W3 may correspond to an average distance between the adjacent third signal lines 30 of the third group 530a.

According to an exemplary embodiment of the present inventive concept, the interval W3 may be greater than the interval W1 and the interval W2. Since the third signal lines 30 of the third group 530a transmit signals of a time-variable polarity, the voltage difference between the adjacent third signal lines 30 may be relatively greater than that of the adjacent first signal lines 10 or the adjacent second signal lines 20. Increasing the interval W3 relative to the interval W1 and the interval W2 mitigates the corrosive effect upon the third signal lines 30.

Further, the intervals between the groups are increased with respect to the interval between signal lines within a group. For example, an interval W4 between the first group 510a and the second group 520a may be greater than the interval W1 and the interval W2. An interval W5 between the second group 520a and the third group 530a may be greater than the interval W1 and the interval W2. Further, the intervals W4 and W5 may be greater than the interval W3. In addition, an interval W6 between the third group 530a and the data signal line group 560 may be greater than the intervals W1, W2, and W3.

By having the intervals W4 and W5 be greater than the intervals W1, W2, and W3, the intensity of an electric field that may occur between the adjacent different polarities of groups 510a, 520a, and 530a is weakened, further reducing the development of corrosion at the signal lines 10, 20, and 30 disposed in the bending region (BDA).

The signal lines 10, 20, and 30 disposed at an edge of at least one of the adjacent groups 510*a*, 520*a*, and 530*a* for transmitting signals of different polarities may include two or more wires connected to each other. In FIG. 2, it is exemplarily illustrated that two second signal lines 20*a* disposed at an edge of the second group 520*a* are connected to each other. As shown in FIG. 2, the two second signal lines 20*a* may be spaced apart from each other in the bending region (BDA), and may be connected to each other in the vicinity of an edge of the bending region (BDA). By connecting two or more wires in the signal lines 10, 20, or 30, the widths and areas of the connected signal lines 10, 20, and 30 is increased to further reduce development of corrosion of the signal lines 10, 20, and 30.

Referring to FIG. 1, the plurality of signal lines (SL) that are partially disposed in the bending region (BDA) may also include a first additional group 510*b*, a second additional group 520*b*, and a third additional group 530*b* that are opposite to the first group 510*a*, the second group 520*a*, and the third group 530*a* with respect to the data signal line group 560. The first additional group 510*b*, the second additional group 520*b*, and the third additional group 530*b* may be symmetrical to the first group 510*a*, the second group 520*a*, and the third group 530*a*, respectively, with respect to the data signal line group 560. The first additional group 510*b* has substantially the same characteristics as the first group 510*a*, the second additional group 520*b* has substantially the same characteristics as the second group 520*a*, and the third additional group 530*b* has substantially the same characteristics as the third group 530*a*.

According to an alternative embodiment of the inventive concept, the first additional group 510*b*, the second additional group 520*b*, and the third additional group 530*b* may be omitted.

Figure 5:
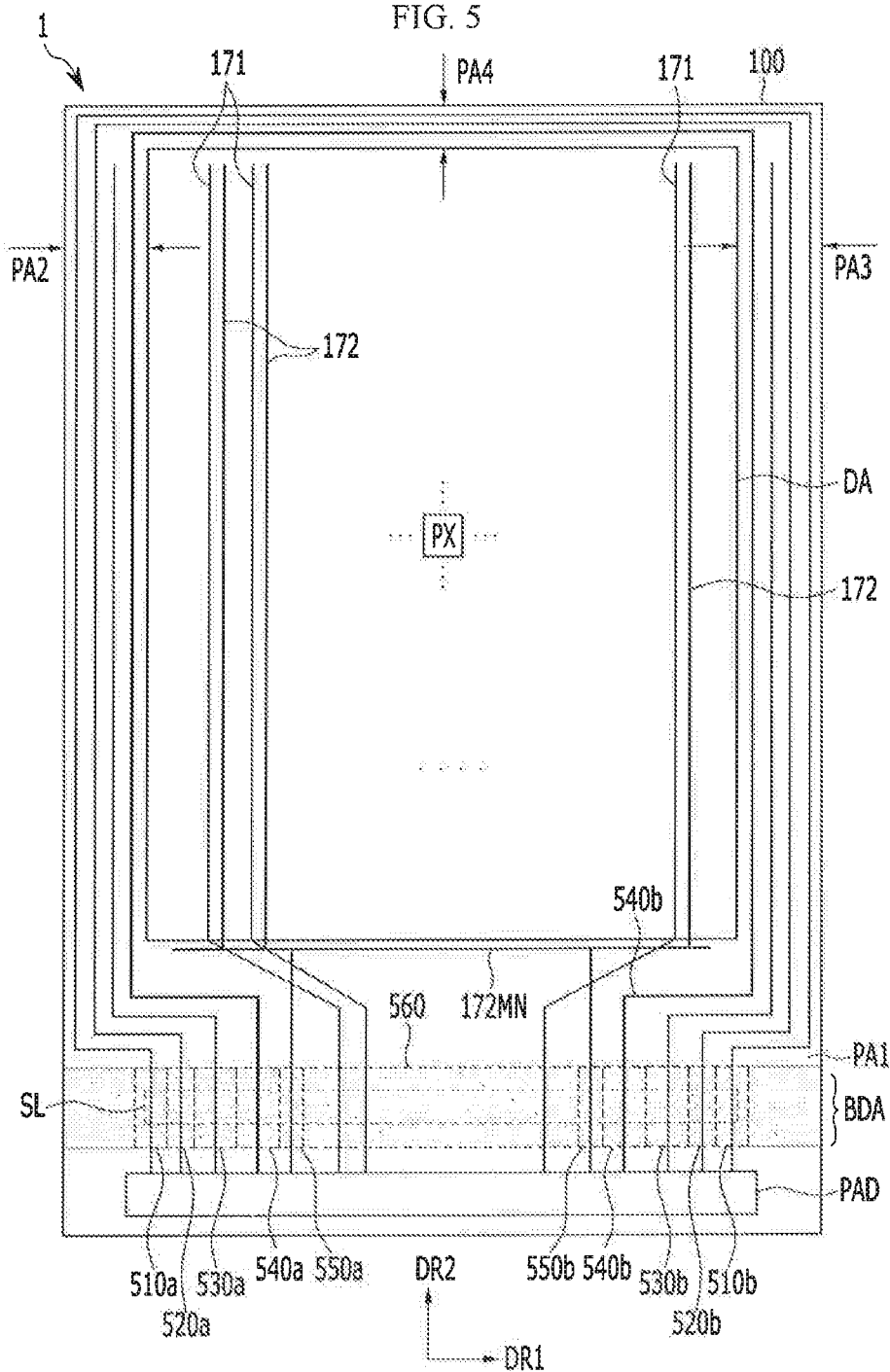
FIG. 5 illustrates a schematic layout view of a display panel included in a display device before the display panel is bent, according to an exemplary embodiment of the inventive concept.
Figure 6:
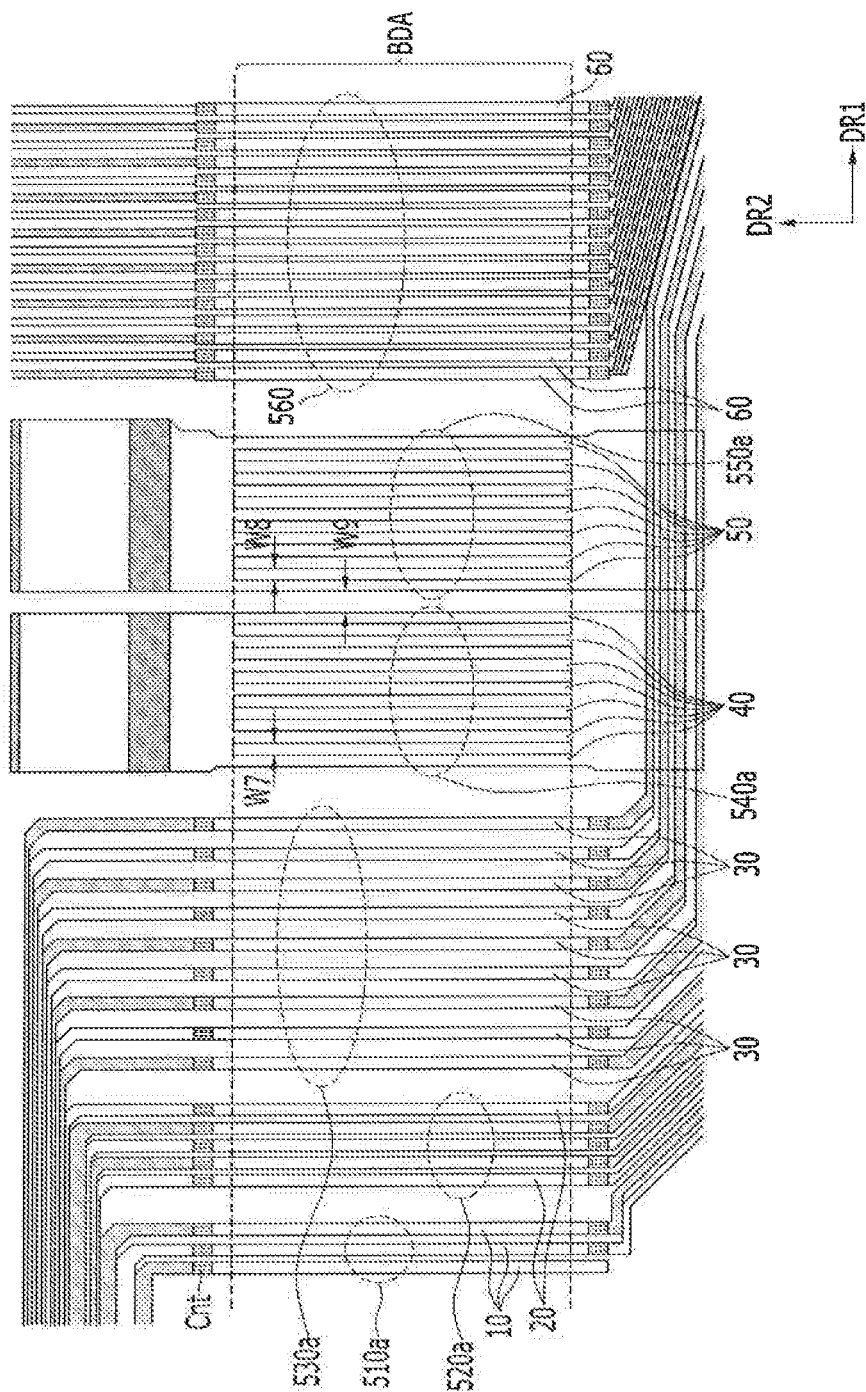
FIG. 6 illustrates an enlarged schematic view of a bending region of a display panel included in a display device according to an exemplary embodiment of the inventive concept.

FIG. 5 illustrates a schematic layout view of a display panel included in a display device before the display panel is bent, according to an exemplary embodiment of the inventive concept. FIG. 6 illustrates an enlarged schematic view of a bending region of a display panel included in a display device according to an exemplary embodiment of the inventive concept.

Referring to FIG. 5, since a display panel 100 included in a display device 1 according to the present exemplary embodiment is substantially the same as that described with reference to FIG. 1 to FIG. 4, only differences therebetween or added configurations will be described.

A plurality of display signal lines in the display area (DA) may include a plurality of data lines 171 and a plurality of driving voltage lines 172 in addition to the aforementioned plurality of gate lines. The plurality of data lines 171 may be substantially the same as the aforementioned plurality of data lines (DL1, DL2, . . . , and DLm).

The plurality of driving voltage lines 172 may be sequentially arranged along the first direction (DR1), and each driving voltage line 172 may substantially extend in the second direction (DR2). The driving voltage line 172 may transmit a driving voltage (ELVDD). The driving voltage (ELVDD) may be a constant voltage with the positive (+) polarity.

A plurality of signal lines (SL) partially disposed in the bending region (BDA) may further include a fourth group 540*a*, a fifth group 550*a*, a fourth additional group 540*b*, and a fifth additional group 550*b* in addition to the data signal line group 560, the first group 510*a*, the second group 520*a*, the third group 530*a*, the first additional group 510*b*, the second additional group 520*b*, and the third additional group 530*b* that are described above.

The fourth group 540*a* and the fifth group 550*a* may be disposed between the data signal line group 560 and one of the first group 510*a*, the second group 520*a*, and the third group 530*a* that is nearest to the data signal line group 560. The fourth group 540*a* and the fifth group 550*a* may be disposed to be adjacent to each other in the bending region (BDA).

The fourth additional group 540*b* and the fifth additional group 550*b* may be disposed between the data signal line group 560 and one of the first additional group 510*b*, the second additional group 520*b*, and the third additional group 530*b* that is nearest to the data signal line group 560. The fourth additional group 540*b* and the fifth additional group 550*b* may be disposed to be adjacent to each other in the bending region (BDA). The fourth additional group 540*b* and the fifth additional group 550*b* may be symmetrical to the fourth group 540*a* and the fifth group 550*a*, respectively, with respect to the data signal line group 560.

Referring to FIG. 5 and FIG. 6, the fourth group 540*a* includes a plurality of fourth signal lines 40, and the fifth group 550*a* includes a plurality of fifth signal lines 50. The plurality of fourth signal lines 40 and the plurality of fifth signal lines 50 may substantially extend to be parallel to each other in the bending region (BDA). In addition, the plurality of signal lines 40 and 50 may extend in the second direction (DR2) in the bending region (BDA) like the signal lines 10, 20, 30, and 60.

The signal lines 40 and 50 may be disposed on the same layer as the signal lines 10, 20, and 30.

The signal lines 10, 20, 30, 40, 50, and 60 may include a portion that extends to be disposed in the bending region (BDA), and the extension portion may be disposed on the same layer as the signal lines 10, 20, 30, 40, 50, and 60 disposed in the bending region (BDA) or on another layer. Referring to FIG. 6, portions of the signal lines 10, 20, 30, and 60 which are disposed inside the bending region (BDA) and portions of the signal lines 10, 20, 30, and 60 which are disposed outside the bending region (BDA) may be connected to each other through contact holes (Cnt) of the aforementioned insulating layers 115 and 120. The contact holes (Cnt) may be formed outside and adjacent to the bending region (BDA).

The plurality of fourth signal lines 40 of the fourth group 540*a* may be connected to each other at the vicinity of the edge of the bending region (BDA) to form one wire in an outside region of the bending region (BDA). Accordingly, the plurality of fourth signal lines 40 may transmit the same signal or voltage. For example, the plurality of fourth signal lines 40 may transmit a constant polarity voltage such as the common voltage (ELVSS). The common voltage (ELVSS) may be a voltage with the negative (−) polarity.

The plurality of fifth signal lines 50 of the fifth group 550*a* may be connected to each other at the vicinity of the edge of the bending region (BDA) to form one wire in an outside region of the bending region (BDA). Accordingly, the plurality of fifth signal lines 50 may transmit the same signal or voltage. The fifth signal lines 50 and the fourth signal lines 40 may transmit different signals. For example, the plurality of fifth signal lines 50 may transmit a constant polarity voltage such as the driving voltage (ELVDD). The driving voltage (ELVDD) may be a constant voltage with the positive (+) polarity.

Referring to FIG. 6, an interval W7 between adjacent signal lines of the plurality of fourth signal lines 40 and an interval W8 between adjacent signal lines of the plurality of fifth signal lines 50 may be substantially the same as one of the interval W1, the interval W2, and the interval W3, but is not limited thereto.

By increasing an interval W9 between the fourth group 540a and the fifth group 550a relative to the interval W7 and the interval W8, the intensity of an electric field that may occur between the fourth and fifth groups 540a and 550a is weakened, thus reducing the development of corrosion at the signal lines 40 and 50 disposed in the bending region (BDA).

The fourth additional group 540b has substantially the same characteristics as the fourth group 540a, and the fifth additional group 550b has substantially the same characteristics as the fifth group 550a. Referring to FIG. 5 and FIG. 6, the fourth signal lines 40 of the fourth group 540a may extend outside of the bending region (BDA), extend along the display area (DA) in the first peripheral area (PA1), and extend along the second direction (DR2) in the peripheral area (PA2). In addition, the signal lines of the fourth additional group 540b may extend outside of the bending region (BDA), extend along the periphery of the display area (DA) in the first peripheral area (PA1), and extend along the second direction (DR2) in the third peripheral area (PA3). The fourth signal lines 40 of the fourth group 540a and the signal lines of the fourth additional group 540b may extend in the second peripheral area (PA2) and the third peripheral area (PA3), respectively, and may be connected to each other in the fourth peripheral area (PA4). Accordingly, the fourth signal lines 40 of the fourth group 540a and the signal lines of the fourth additional group 540b may be provided in a portion surrounding the display area (DA) in the peripheral areas (PA2, PA3, and PA4), and transmit the common voltage (ELVSS) along the periphery of the display area (DA).

The fifth signal lines 50 of the fifth group 550a and the signal lines of the fifth additional group 550b may extend outside of the bending region (BDA) to extend along the second direction (DR2) toward the display area (DA) in the first peripheral area (PA1). The fifth signal lines 50 of the fifth group 550a and the signal lines of the fifth additional group 550b may be connected to a driving voltage transmitting line 172MN extending along an edge of the display area (DA) adjacent to the first peripheral area (PA1).

Referring to FIG. 5, the driving voltage transmitting line 172MN extends in a direction substantially parallel to the first direction (DR1). The plurality of driving voltage lines 172 disposed in the display area (DA) may be connected to the driving voltage transmitting line 172MN at the edge of the display area (DA).

The first signal lines 10 of the first group 510a and the signal lines of the first additional group 510b may extend outside of the bending region (BDA), extend along the periphery of the display area (DA) in the first peripheral area (PA1), and extend along the second direction (DR2) in the second peripheral area (PA2) and the third peripheral area (PA3). The first signal lines 10 of the first group 510a and the signal lines of the first additional group 510b extend in the second direction (DR2) in the second peripheral area (PA2) and the third peripheral area (PA3), respectively. The first signal lines 10 of the first group 510a and the signal lines of the first additional group 510b may be connected to each other in the fourth peripheral area (PA4) or may not extend to the fourth peripheral area (PA4).

The second signal lines 20 of the second group 520a and the signal lines of the second additional group 520b may extend outside of the bending region (BDA), extend along the periphery of the display area (DA) in the first peripheral area (PA1), and extend along the second direction (DR2) in the second peripheral area (PA2) and the third peripheral area (PA3). The second signal lines 20 of the second group 520a and the signal lines of the second additional group 520b may extend in the second direction (DR2) in the second peripheral area (PA2) and the third peripheral area (PA3), respectively. The second signal lines 20 of the second group 520a and the signal lines of the second additional group 520b may be connected to each other in the fourth peripheral area (PA4) or may not extend to the fourth peripheral area (PA4).

The third signal lines 30 of the third group 530a and the signal lines of the third additional group 530b may extend outside of the bending region (BDA), extend along the periphery of the display area (DA) in the first peripheral area (PA1), and extend along the second direction (DR2) in the second peripheral area (PA2) and the third peripheral area (PA3). The third signal lines 30 of the third group 530a and the signal lines of the third additional group 530b may extend in the second direction (DR2) in the second peripheral area (PA2) and the third peripheral area (PA3), respectively. The third signal lines 30 of the third group 530a and the signal lines of the third additional group 530b may be connected to each other in the fourth peripheral area (PA4) or may not extend to the fourth peripheral area (PA4). The plurality of third signal lines 30 of the third group 530a and the signal lines of the third additional group 530b may include signal lines that are connected to each other in the fourth peripheral area (PA4), and may include signal lines that are not connected to each other in the fourth peripheral area (PA4).

The data signal lines 60 of the data signal line group 560 may extend outside of the bending region (BDA), extend in a fan-out form toward the display area (DA) in the first peripheral area (PA1), and may be connected to the data lines 171 of the display area (DA) to transmit a data signal.

Referring to FIG. 5 and FIG. 6, the signal lines 10, 20, 30, 40, 50, and 60 disposed in the bending region (BDA) may extend downward from the bending region (BDA) to form a pad (PAD), or signal pad, corresponding to end portions of the signal lines. The pad (PAD) may be connected to a printed circuit film on which driving circuit chips are mounted. The pad (PAD) may be connected to a plurality of electrical nodes in the display area (DA) by the plurality of signal lines (SL).

Figure 7:
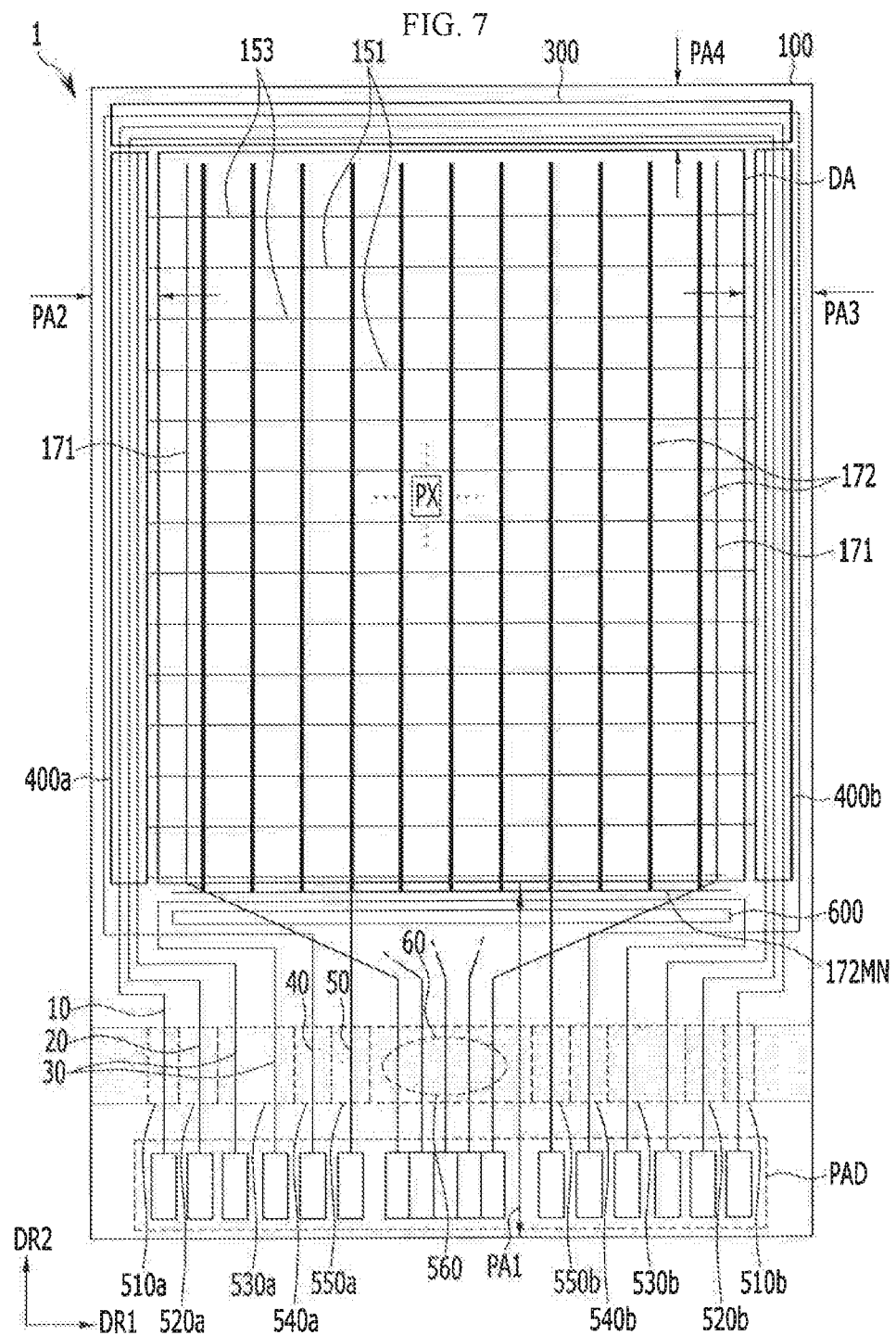
FIG. 7 illustrates a schematic layout view of a display panel included in a display device before the display panel is bent, according to an exemplary embodiment of the inventive concept.
Figure 8:
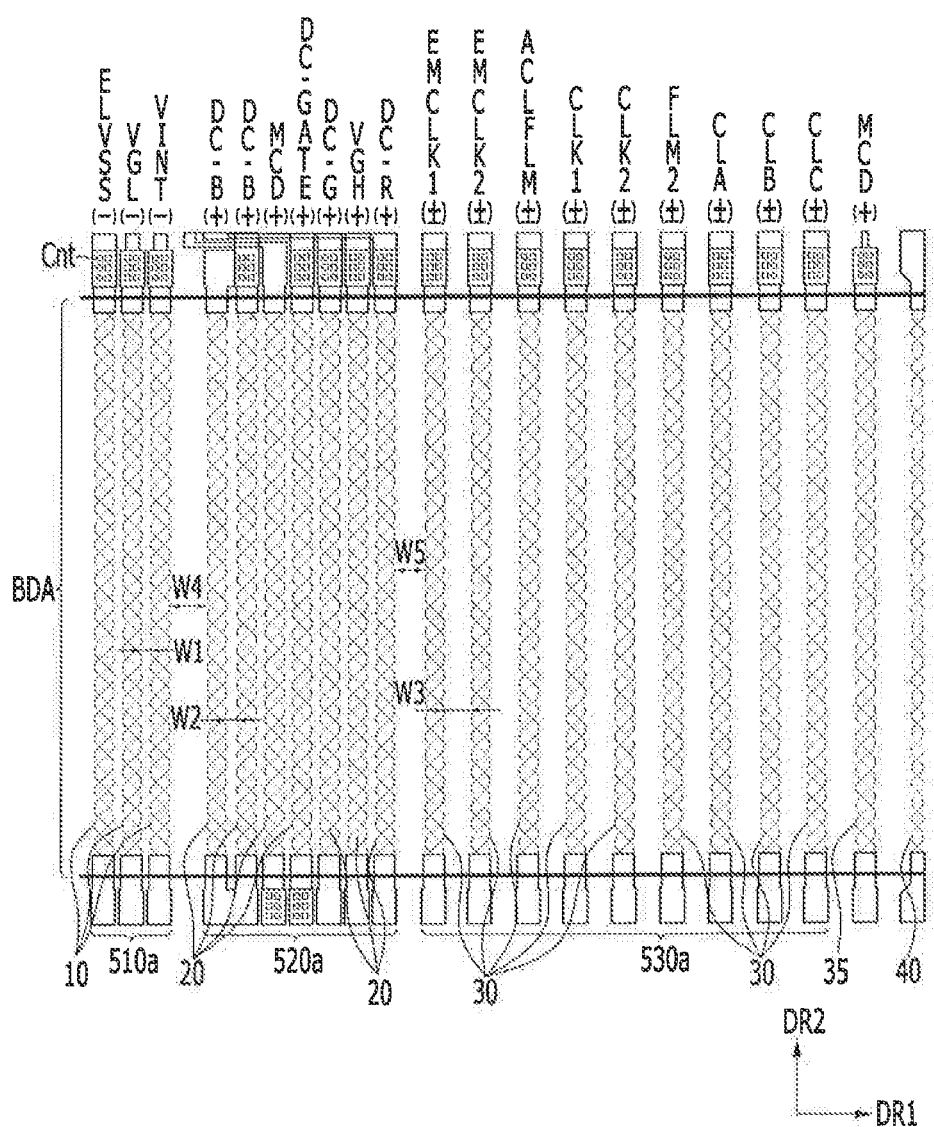
FIG. 8 and FIG. 9 illustrate enlarged schematic views of a bending region of a display panel included in a display device according to exemplary embodiments of the inventive concept.
Figure 9:
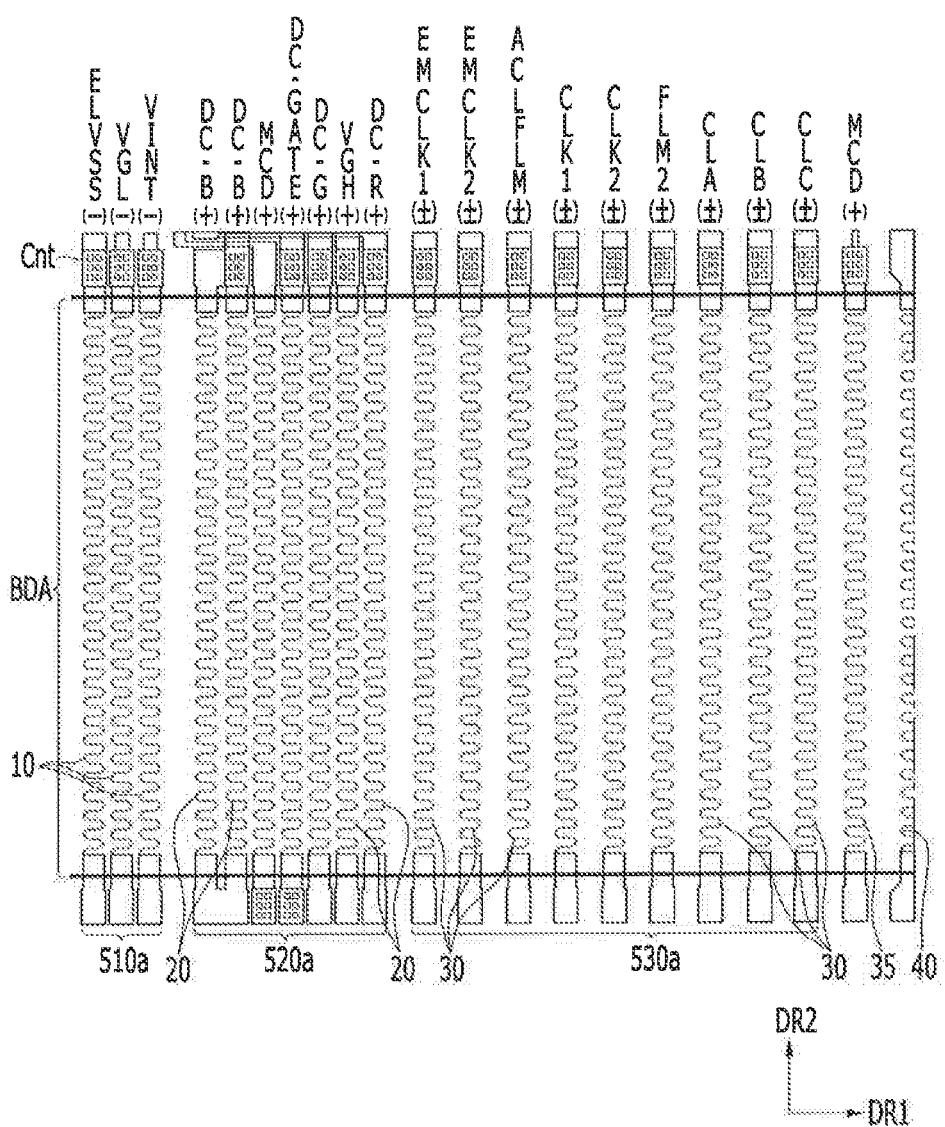

FIG. 7 illustrates a schematic layout view of a display panel included in a display device before the display panel is bent, according to an exemplary embodiment of the inventive concept. FIG. 8 and FIG. 9 illustrate enlarged schematic views of a bending region of a display panel included in a display device according to an exemplary embodiment of the inventive concept.

Descriptions for similar constituent elements as in the exemplary embodiments described above will be omitted.

Referring to FIG. 7, a plurality of display signal lines in the display area (DA) may further include a plurality of gate lines 151 and a plurality of light emitting control lines 153, in addition to the aforementioned plurality of data lines 171 and plurality of driving voltage lines 172. The plurality of gate lines 151 may be substantially the same as the aforementioned plurality of gate lines (GL1, GL2, . . . , and GLn).

The plurality of light emitting control lines 153 may be sequentially arranged along the second direction (DR2), and each light emitting control line 153 may substantially extend in the first direction (DR1). The light emitting control lines 153 may transmit a light emitting control signal. The light emitting control lines 153 and the gate lines 151 may be alternately arranged in the second direction (DR2).

The gate driver 400a may be disposed in the second peripheral area (PA2), the gate driver 400b may be disposed in the third peripheral area (PA3), a turn-on circuit portion 300 may be disposed in the fourth peripheral area (PA4), and a data input circuit portion 600 may be disposed between the bending region (BDA) and the display area (DA).

According to present exemplary embodiment, the gate drivers 400a and 400b may further include a circuit for transmitting the light emitting control signal to the plurality of light emitting control lines 153.

The turn-on circuit portion 300 may include a plurality of transistors, and may inspect whether the display panel 100 has cracks.

The data input circuit portion 600 may include a plurality of transistors and a demultiplexer circuit connected to the data lines 171 of the display area (DA).

Referring to FIG. 7 to FIG. 9, the plurality of first signal lines 10 of the first group 510a and the signal lines of the first additional group 510b may include, for example, the signal line for transmitting the common voltage (ELVSS), a signal line for transmitting a gate low voltage (VGL), and a signal line for transmitting an initialization voltage (VINT).

Like the first signal lines 10 shown in FIG. 7, the signal line for transmitting the common voltage (ELVSS) may include portions extending along the second, third, and fourth peripheral areas (PA2, PA3, and PA4). The signal line for transmitting the common voltage (ELVSS) may serve as a guard ring.

Like the first signal lines 10 shown in FIG. 7, the signal line for transmitting the gate low voltage (VGL) may include portions extending along the second, third, and fourth peripheral areas (PA2, PA3, and PA4), or alternatively, it may not include the portion disposed in the fourth peripheral area (PA4). The signal line for transmitting the gate low voltage (VGL) may be connected to the gate drivers 400a and 400b. The gate low voltage (VGL) may be used when a low voltage level of the gate signal is generated by the gate drivers 400a and 400b.

Unlike the first signal lines 10 shown in FIG. 7, the signal line for transmitting the initialization voltage (VINT) may include only the portions extending along the second and third peripheral areas (PA2 and PA3), and does not include the portion extending along the fourth peripheral area (PA4). The signal line for transmitting the initialization voltage (VINT) may be connected to an initialization voltage transmitting line disposed in the display area (DA) to transmit the initialization voltage (VINT). The initialization voltage (VINT) may be used to drive the pixel (PX).

Referring to FIG. 7 to FIG. 9, the plurality of second signal lines 20 of the second group 520a and the signal lines of the second additional group 520b may include, for example, signal lines for transmitting RGB constant voltages (DC_R, DC_G, and DC_B), a signal line for transmitting a gate constant voltage (DC_GATE), a signal line for transmitting a gate high voltage (VGH), and a signal line for transmitting a sensing voltage (MCD).

Like the second signal lines 20 shown in FIG. 7, the signal lines for transmitting the RGB constant voltages (DC_R, DC_G, and DC_B), the signal line for transmitting the gate constant voltage (DC_GATE), and the signal line for transmitting the sensing voltage (MCD) may include portions extending along the second direction (DR2) in the second and third peripheral area (PA2 and PA3) and portions extending along the first direction (DR1) in the fourth peripheral area (PA4).

The signal lines for transmitting the RGB constant voltages (DC_R, DC_G, and DC_B) may be connected to the turn-on circuit portion 300 to transmit the RGB constant voltages (DC_R, DC_G, and DC_B) to an input terminal of at least one transistor included in the turn-on circuit portion 300.

The signal line for transmitting the gate constant voltage (DC_GATE) may be connected to the turn-on circuit portion 300 to transmit the gate constant voltage (DC_GATE) to a control terminal of at least one transistor included in the turn-on circuit portion 300.

The signal line for transmitting the sensing voltage (MCD) may extend to be substantially parallel to the signal lines for transmitting the RGB constant voltages (DC_R, DC_G, and DC_B), and may be connected to the signal lines for transmitting the RGB constant voltages (DC_R, DC_G, and DC_B) in the second peripheral area (PA2) and the third peripheral area (PA3).

Like the second signal lines 20 shown in FIG. 7, the signal line for transmitting the gate high voltage (VGH) of may include a portion extending along the second, third, and fourth peripheral areas (PA2, PA3, and PA4), but does not include a portion disposed in the fourth peripheral area (PA4). The signal line for transmitting the gate high voltage (VGH) may be connected to the gate drivers 400a and 400b. The gate high voltage (VGH) may be used to generate the high voltage level of the gate signal.

Referring to FIG. 7 to FIG. 9, the plurality of third signal lines 30 of the third group 530a and the signal lines of the third additional group 530b may include, for example, signal lines for transmitting light emitting clock signals (EMCLK1 and EMCLK2), a signal line for transmitting a light emitting frame signal (ACLFLM), signal lines for transmitting clock signals (CLK1 and CLK2), a signal line for transmitting a frame signal (FLM2), and signal lines for transmitting data control signals (CLA, CLB, and CLC).

As illustrated in FIG. 7, according to an exemplary embodiment of the inventive concept, a portion of the plurality of third signal lines 30 (or left third signal lines 30) may extend along the second direction (DR2) in the second and third peripheral areas (PA2 and PA3). A portion of the plurality of third signal lines 30 (or right third signal lines 30) may be disposed only in the first peripheral area (PA1).

Like the left third signal lines 30 shown in FIG. 7, the signal lines for transmitting the light emitting clock signals (EMCLK1 and EMCLK2), the signal line for transmitting the light emitting frame signal (ACLFLM), the signal lines for transmitting the clock signals (CLK1 and CLK2), and the signal line for transmitting the frame signal (FLM2) may include portions extending along the second direction (DR2) in the second and third peripheral areas (PA2 and PA3).

The signal lines for transmitting the light emitting clock signals (EMCLK1 and EMCLK2) may be connected to the gate drivers 400a and 400b to input the light emitting clock signals (EMCLK1 and EMCLK2) to a circuit for generating the light emitting control signals of the gate drivers 400a and 400b.

The signal line for transmitting the light emitting frame signal (ACLFLM) may be connected to the gate drivers 400a and 400b. The light emitting frame signal (ACLFLM) may instruct a start of one frame for inputting the light emitting control signal to the display area (DA).

The signal lines for transmitting the clock signals (CLK1 and CLK2) may be connected to the gate drivers 400a and 400b to input clock signals (CLK1 and CLK2) to a circuit for generating the gate signal.

The signal line for transmitting the frame signal (FLM2) is connected to the gate drivers 400a and 400b. The frame signal (FLM2) may instruct the start of one frame for inputting the gate signal to the display area (DA).

Like the right third signal lines 30 shown in FIG. 7, the signal lines for transmitting the data control signals (CLA, CLB, and CLC) may be disposed only in the first peripheral area (PA1). The signal lines for transmitting the data control signals (CLA, CLB, and CLC) may extend outside of the bending region (BDA) substantially in the second direction (DR2), and may extend to partially surround the data input circuit portion 600. In other words, the signal lines for transmitting the data control signals (CLA, CLB, and CLC) include portions that are adjacent to the data input circuit portion 600 and extend substantially in the first direction (DR1). The signal lines for transmitting the data control signals (CLA, CLB, and CLC) may be connected to the data input circuit portion 600 to transmit the data control signals (CLA, CLB, and CLC) to the gate terminal of at least one transistor included in the data input circuit portion 600.

Referring to FIG. 8 and FIG. 9, the display panel 100 may further include a sensing signal line 35 for transmitting the sensing voltage (MCD) positioned between the third group 530a and the fourth signal lines 40 of the fourth group 540a. The sensing signal line 35 may extend to be substantially parallel to the signal lines for transmitting the sensing voltage (MCD) of the aforementioned second group 520a and second additional group 520b in the bending region (BDA) and the region outside the bending region (BDA). The position of the sensing signal line 35 in the bending region (BDA) is not limited to that shown in FIG. 8 and FIG. 9. For example, according to an alternative embodiment, the sensing signal line 35 may be positioned in the first group 510a and the first additional group 510b, or may be omitted.

Referring to FIG. 8 and FIG. 9, as described above, two or more signal lines within at least one of the signal lines 10, 20, and 30 disposed on the edge of the groups 510a, 520a, and 530a, respectively, may be connected to each other. In FIG. 8 and FIG. 9, it is exemplarily illustrated that a signal line for transmitting a B-constant voltage (DC_B) on the left edge of the second group 520a consists of two wires that are connected to each other.

As described above, the interval W4 between the first group 510a and the second group 520a or the interval W5 between the second group 520a and the third group 530a may be greater than the interval W1 between the adjacent first signal lines 10 and the interval W2 between the adjacent second signal lines 20. In addition, the interval W3 between the adjacent third signal lines 30 may be greater than the intervals W1 and W2.

Referring to FIG. 8, the signal lines 10, 20, 30, and 40 disposed in the bending region (BDA) may be in a mesh form to improve flexibility, and when the display panel 100 is bent in the bending region (BDA), even if some of the signal lines 10, 20, 30, and 40 of the bending region (BDA) are cut, a by-pass circuit may be ensured. Thus, it is possible to prevent the display panel 100 from failing.

Referring to FIG. 9, unlike as shown in FIG. 8, each of the signal lines 10, 20, 30, and 40 disposed in the bending region (BDA) may be in a serpentine form to reduce damage to the signal lines 10, 20, 30, and 40 due to the bending.

Referring to FIG. 7 to FIG. 9, the signal lines 10, 20, 30, 40, 50, and 60 disposed in the bending region (BDA) may extend downward from the bending region (BDA) to form a plurality of signal pads (PAD), corresponding to end portions of the signal lines. The plurality of signal pads (PAD) may be connected to a printed circuit film on which driving circuit chips are mounted. The plurality of signal pads (PAD) may be connected to a plurality of electrical nodes in the display area (DA) by the plurality of signal lines (SL).

Figure 10:
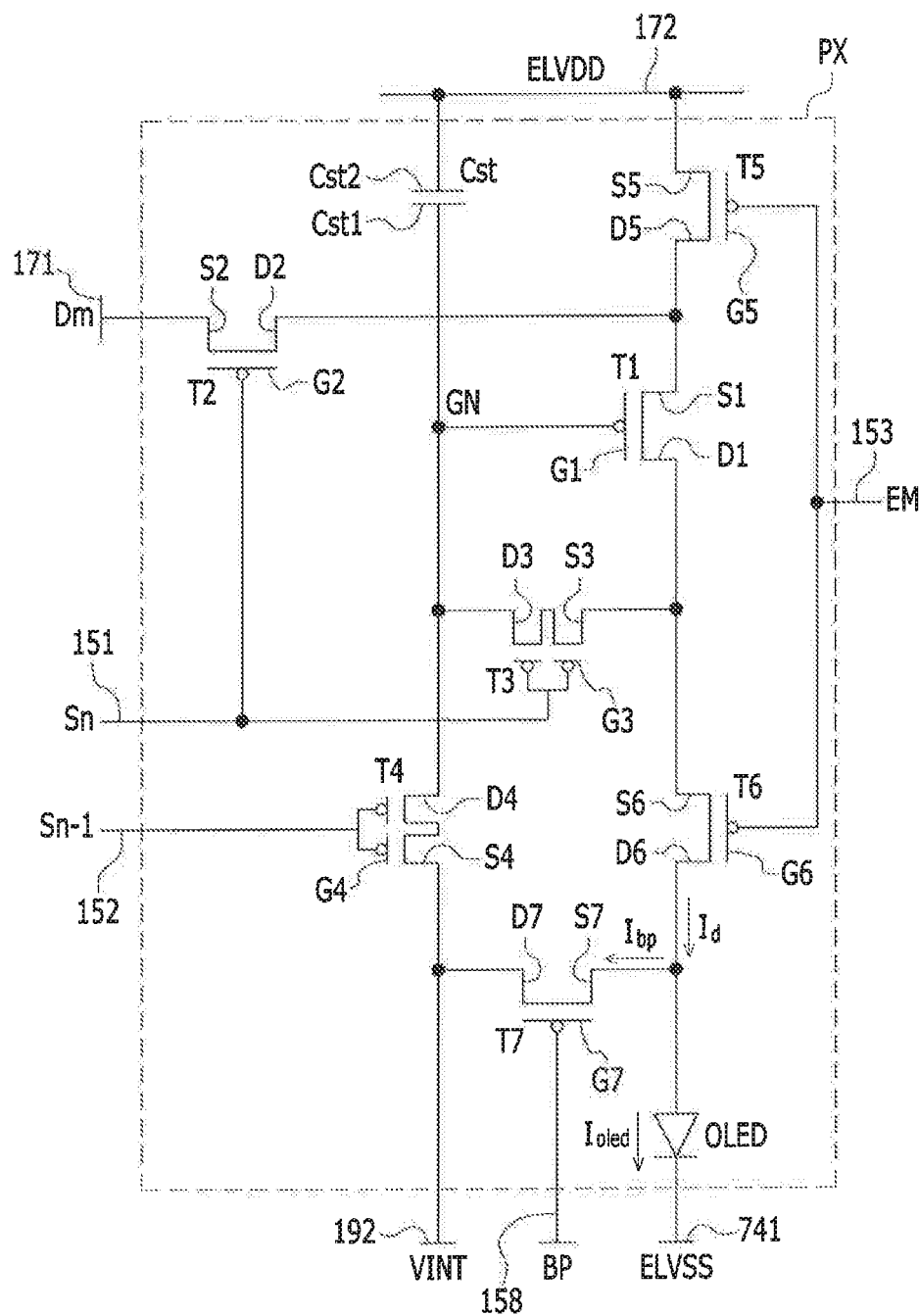
FIG. 10 illustrates an equivalent circuit diagram of one pixel of a display device according to an exemplary embodiment of the inventive concept.

FIG. 10 illustrates an equivalent circuit diagram of one pixel of a display device according to an exemplary embodiment of the inventive concept.

Referring to FIG. 10, according to an exemplary embodiment of the inventive concept, a display device corresponds to an organic light emitting diode display, and a pixel (PX) disposed in a display area (DA) thereof may include a plurality of transistors (T1, T2, T3, T4, T5, T6, and T7) connected to a plurality of display signal lines (151, 152, 153, 158, 171, 172, and 192), a storage capacitor (Cst), and an organic light emitting diode (OLED).

The transistors (T1, T2, T3, T4, T5, T6, and T7) may include a driving transistor T1, a switching transistor T2, a compensation transistor T3, an initialization transistor T4, an operation control transistor T5, a light emission control transistor T6, and a bypass transistor T7.

The display signal lines (151, 152, 153, 158, 171, 172, and 192) may include a gate line 151, a previous gate line 152, a light emitting control line 153, a bypass control line 158, a data line 171, a driving voltage line 172, and an initialization voltage line 192. The gate line 151 and the previous gate line 152 may be connected to the gate signal generating circuit of the aforementioned gate drivers 400a and 400b to receive a gate signal (Sn) and a previous gate signal (Sn−1), respectively, and the light emitting control line 153 may be connected to the light emitting control signal generating circuit of the gate drivers 400a and 400b to receive a light emitting control signal (EM).

The previous gate line 152 transmits the previous gate signal (Sn−1) to the initialization transistor T4, the light emitting control line 153 transmits the light emitting control signal (EM) to the operation control transistor T5 and the light emitting transistor T6, and the bypass control line 158 transmits the bypass signal (BP) to the bypass transistor T7.

The data line 171 may receive a data signal (Dm) through the data signal line group 560 and the data input circuit portion 600 that are described above. The driving voltage line 172 may receive a driving voltage (ELVDD) through the fifth signal lines 50 of the fifth group 550a, the signal lines of the fifth additional group 550b, and the driving voltage transmitting line 172MN that are described above. The initialization voltage line 192 may receive an initialization voltage (VINT) for initializing the driving transistor T1 through the aforementioned signal line for transmitting the initialization voltage (VINT) of the first group 510a.

A gate electrode G1 of the driving transistor T1 is connected to a first terminal (Cst1) of the storage capacitor (Cst), a source electrode S1 of the driving transistor T1 is connected to the driving voltage line 172 via the operation control transistor T5, and a drain electrode D1 of the driving transistor T1 is connected to an anode of the organic light emitting diode (OLED) via the light emitting transistor T6.

A gate electrode G2 of the switching transistor T2 is connected to the gate line 151, a source electrode S2 of the switching transistor T2 is connected to the data line 171, and a drain electrode D2 of the switching transistor T2 is connected to the source electrode S1 of the driving transistor T1 and to the driving voltage line 172 via the operation control transistor T5.

A gate electrode G3 of the compensation transistor T3 is connected to the gate line 151, a source electrode S3 of the compensation transistor T3 is connected to the drain electrode D1 of the driving transistor T1 and to the anode of the organic light emitting diode (OLED) via the light emitting transistor T6, and a drain electrode D3 of the compensation transistor T3 is connected to the drain electrode D4 of the initialization transistor T4, the first terminal (Cst1) of the storage capacitor (Cst), and the gate electrode G1 of the driving transistor T1.

A gate electrode G4 of the initialization transistor T4 is connected to the previous gate line 152, a source electrode S4 of the initialization transistor T4 is connected to the initialization voltage line 192, and a drain electrode D4 of the initialization transistor T4 is connected to the first terminal (Cst1) of the storage capacitor (Cst), the gate electrode G1 of the driving transistor T1, and the drain electrode D3 of the compensation transistor T3.

A gate electrode G5 of the operation control transistor T5 is connected to the light emitting control line 153, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emitting transistor T6 is connected to the light emitting control line 153, a source electrode S6 of the light emitting transistor T6 is connected to the drain electrode D1 of the driving transistor T1 and the source electrode S3 of the compensation transistor T3, and a drain electrode D6 of the light emitting transistor T6 is connected to the anode of the organic light emitting diode (OLED).

A gate electrode G7 of the bypass transistor T7 is connected to the bypass control line 158, a source electrode S7 of the bypass transistor T7 is connected to the drain electrode D6 of the light emitting transistor T6 and the anode of the organic light emitting diode (OLED), and a drain electrode D7 of the bypass transistor T7 is connected to the initialization voltage line 192 and the source electrode S4 of the initialization transistor T4.

A second terminal (Cst2) of the storage capacitor (Cst) is connected to the driving voltage line 172, and a cathode of the organic light emitting diode (OLED) is connected to a common voltage line 741 for transmitting the common voltage (ELVSS). The common voltage line 741 or the cathode of the organic light emitting diode (OLED) may receive the common voltage (ELVSS) from the aforementioned plurality of fourth signal lines 40 of the fourth group 540a.

The circuit structure of the pixel (PX) is not limited to that shown in FIG. 10, and the number of transistors and capacitors may vary.

Figure 11:
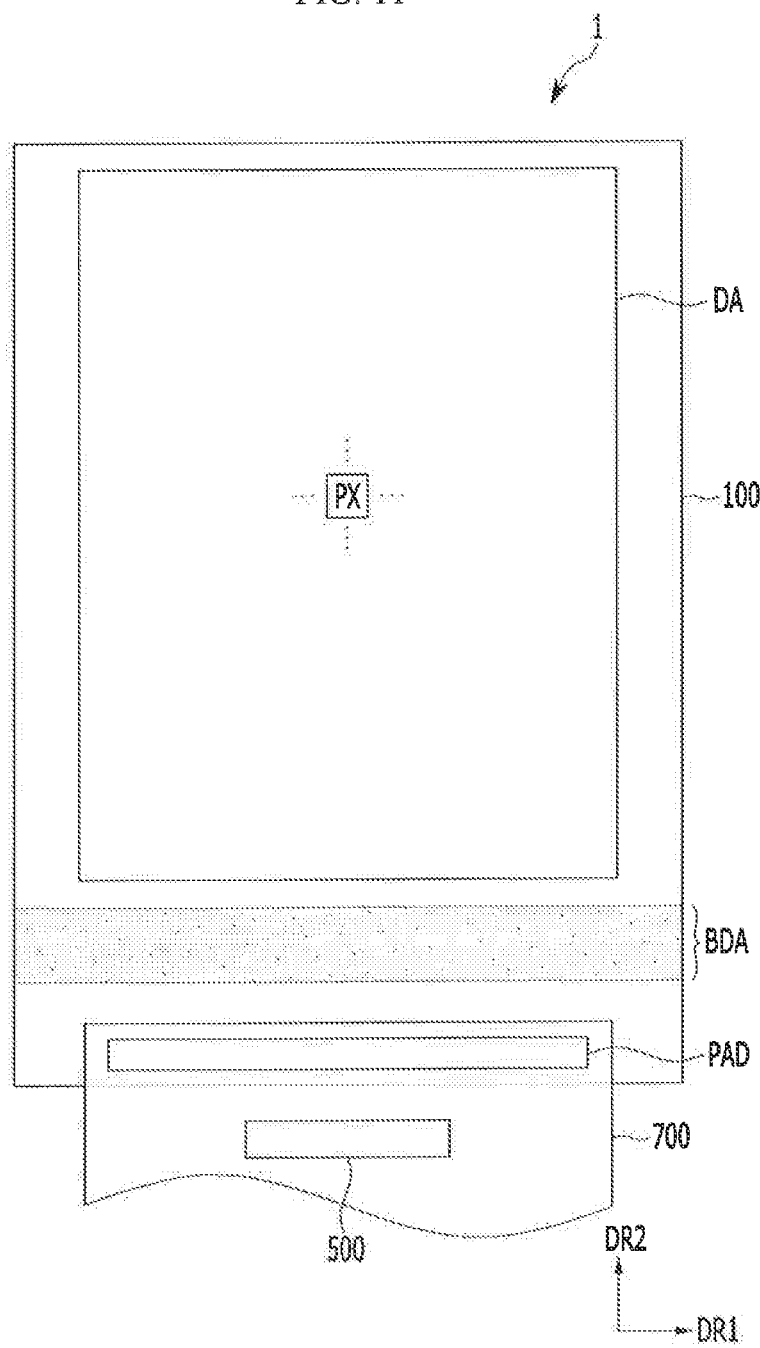
FIG. 11 and FIG. 12 illustrate schematic layout views of the display device before the display panel included in the display device is bent, according to an exemplary embodiment of the inventive concept.
Figure 12:
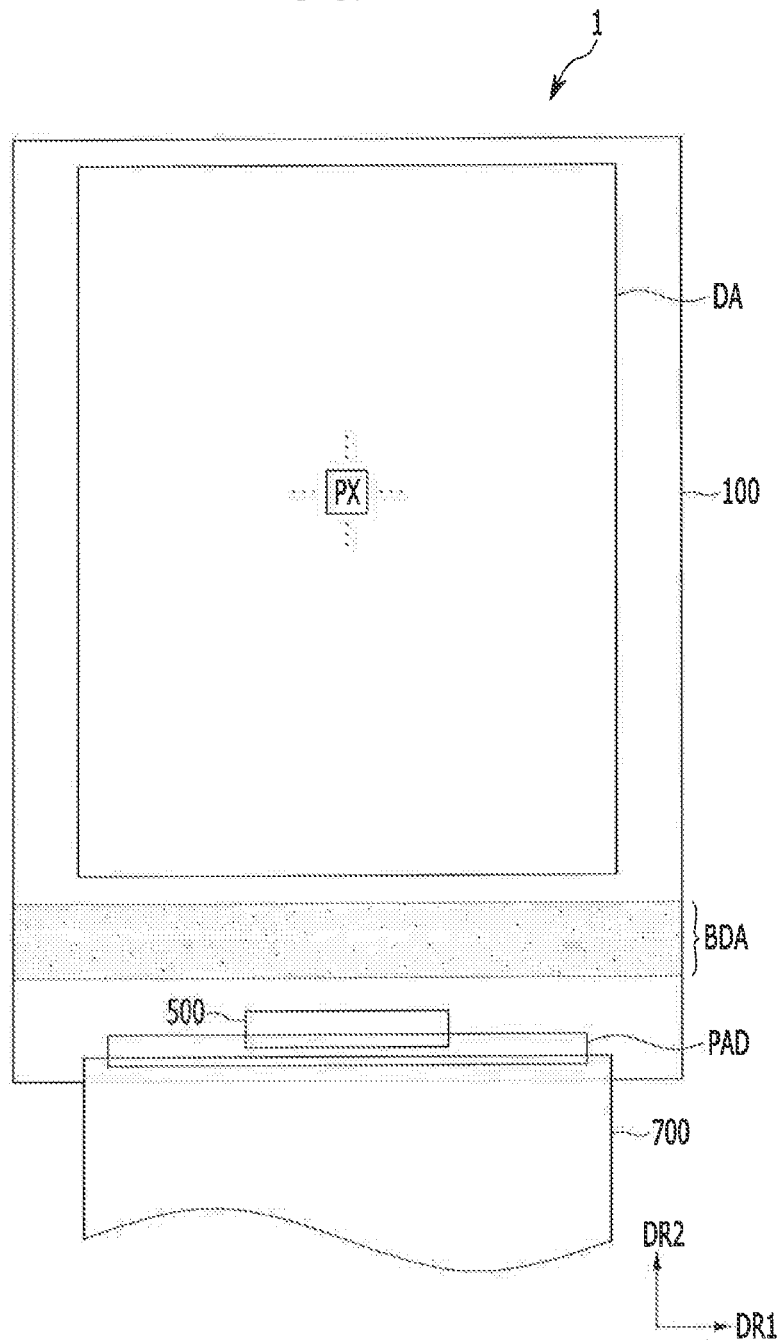

FIG. 11 and FIG. 12 illustrate schematic layout views of the display device before the display panel included in the display device is bent, according to an exemplary embodiment of the inventive concept.

Descriptions for similar constituent elements as in the exemplary embodiments described above will be omitted.

Referring to FIG. 11, according to an exemplary embodiment of the inventive concept, the display device 1 may include the aforementioned display panel 100 and a printed circuit film 700 connected to the display panel 100. A plurality of signal wires may be disposed in the printed circuit film 700, and a driver 500 may be mounted on one surface of the printed circuit film 700.

The first signal lines 10 included in the first group 510a, the signal lines included in the first additional group 510b, the second signal lines 20 included in the second group 520a, the signal lines included in the second additional group 520b, the fourth signal lines 40 included in the fourth group 540a, the signal lines included in the fourth additional group 540b, the fifth signal lines 50 included in the fifth group 550a, and the signal lines included in the fifth additional group 550b, which are described above, may be connected to the printed circuit film 700 through the pad (PAD) to receive signals or voltages.

The third signal lines 30 included in the third group 530a, the signal lines included in the third additional group 530b, and the data signal lines 60 included in the data signal line group 560, which are described above, may be connected to the signal wires of the printed circuit film 700 through the pad (PAD) to receive signals from the driver 500.

Referring to FIG. 12, according to an exemplary embodiment of the inventive concept, the display device 1 is substantially the same as that shown in FIG. 11, but the driver 500 may be mounted on the display panel 100.

The first signal lines 10 included in the first group 510a, the signal lines included in the first additional group 510b, the second signal lines 20 included in the second group 520a, the signal lines included in the second additional group 520b, the fourth signal lines 40 included in the fourth group 540a, the signal lines included in the fourth additional group 540b, the fifth signal lines 50 included in the fifth group 550a, and the signal lines included in the fifth additional group 550b, which are described above, may be connected to the printed circuit film 700 through the pad (PAD) to receive signals or voltages.

The third signal lines 30 included in the third group 530a, the signal lines included in the third additional group 530b, and the data signal lines 60 included in the data signal line group 560 may receive signals from the driver 500 through the pad (PAD).

While the inventive concept has been shown and described with reference to exemplary embodiments thereof, it is to be understood to those of ordinary skill in the art that various modifications in form and detail may be made thereto without departing from the spirit and scope of the inventive concept as defined by the following claims.

What is claimed is:

1. A display device comprising:
a display panel that includes a display area including a plurality of pixels and a first peripheral area adjacent to the display area,
wherein:
the first peripheral area includes a bendable region, a plurality of pads, and a plurality of signal lines partially included in the bendable region and respectively connected to the plurality of pads, the bendable region extending from a first edge of the display panel to a second edge of the display panel opposing the first edge,
the plurality of signal lines includes a first group and a second group that are adjacent to each other in the bendable region,
the first group includes two or more first signal lines among the plurality of signal lines, the two or more first signal lines not electrically connected to each other in the entire first peripheral area,
the second group includes two or more second signal lines among the plurality of signal lines, the two or more second signal lines not electrically connected to each other in the entire first peripheral area,
the two or more first signal lines included in the first group transmit signals of a first polarity,
the two or more second signal lines included in the second group transmit signals of a second polarity that is opposite to the first polarity, the first group and the second group are separated by a first interval in the bendable region, and adjacent signal lines within the first group or the second group are separated by a second interval in the bendable region, and the first interval is greater than the second interval, and the display area and the bendable region commonly include a same substrate as each other.

2. The display device of claim 1, wherein
the plurality of signal lines further includes a third group adjacent to the first group or the second group in the bendable region,
the third group includes two or more third signal lines among the plurality of signal lines, and
the two or more third signal lines included in the third group transmit signals having polarities that vary according to time.

3. The display device of claim 2, wherein
signal lines within the third group are separated by a third interval, and
the third interval is greater than the second interval.

4. The display device of claim 3, wherein
the first interval is greater than the third interval.

5. The display device of claim 2, wherein
two or more signal lines, among the plurality of signal lines, adjacent to each other and disposed at an edge of at least one group among the first group, the second group, and the third group are connected to one another.

6. The display device of claim 2, wherein
the plurality of signal lines extend in a direction different from an extension direction of the bendable region,
the display panel further includes a second peripheral area and a third peripheral area that are each connected to the first peripheral area and adjacent to the display area,
the second peripheral area and the third peripheral area are opposite each other with respect to the display area, and
at least one signal line, among the first signal lines included in the first group, the second signal lines included in the second group, and the third signal lines included in the third group, includes a portion extending into the second peripheral area in a direction different from the extension direction of the bendable region.

7. The display device of claim 6, wherein
at least one signal line among the two or more third signal lines included in the third group is disposed only in the first peripheral area, and includes a portion substantially parallel to the extension direction of the bendable region.

8. The display device of claim 7, wherein
the first peripheral area includes a transistor connected to the at least one signal line among the two or more third signal lines disposed only in the first peripheral area.

9. The display device of claim 6, wherein
the display area includes a plurality of data lines and a plurality of gate lines that are connected to the plurality of pixels,
the second peripheral area includes a gate driver for transmitting a gate signal to the plurality of gate lines, and
the at least one signal line, among the first signal lines, the second signal lines, and the third signal lines, that includes the portion extending into the second peripheral area in the direction different from the extension direction of the bendable region is connected to the gate driver.

10. The display device of claim 6, wherein
the display panel further includes a fourth peripheral area that is connected to both the second peripheral area and the third peripheral area, and is adjacent to the display area,
the fourth peripheral area and the first peripheral area are opposite each other with respect to the display area, and
at least one signal line, among the first signal lines included in the first group and the second signal lines included in the second group, includes a portion extending into the fourth peripheral area in a direction substantially parallel to the extension direction of the bendable region.

11. The display device of claim 10, wherein
the fourth peripheral area includes a transistor connected to the at least one signal line among the first signal lines and the second signal lines that extends into the fourth peripheral area.

12. The display device of claim 1, wherein
two or more signal lines, among the plurality of signal lines, adjacent to each other and disposed at an edge of at least one group among the first group and the second group are connected to one another.

13. The display device of claim 1, wherein
the plurality of signal lines extend in a direction different from an extension direction of the bendable region,
the plurality of signal lines includes a data signal line group for transmitting data signals and a third group adjacent to the first group or the second group in the bendable region,
the first group, the second group, and the third group are disposed between an edge of the bendable region and the data signal line group, and
the data signal line group is disposed substantially at a central portion of the bendable region among the plurality of signal lines, along the extension direction of the bendable region.

14. The display device of claim 13, wherein
the plurality of signal lines includes a first additional group, a second additional group, and a third additional group that are disposed opposite to the first group, the second group, and the third group, respectively, with respect to the data signal line group,
the first additional group, the second additional group, and the third additional group each include at least one of the plurality of signal lines,
the signal lines included in the first additional group transmit signals of the first polarity,
the signal lines included in the second additional group transmit signals of the second polarity, and
the signal lines included in the third additional group transmit signals having a polarity that varies according to time.

15. The display device of claim 1, wherein
the plurality of signal lines includes a data signal line group for transmitting data signals, and a third group, a fourth group, and a fifth group that are adjacent to the first group or the second group in the bendable region,
the first group, the second group, and the third group are disposed between an edge of the bendable region and the data signal line group,
the fourth group and the fifth group are disposed between the data signal line group and a group among the first group, the second group, and the third group that is nearest to the data signal line group,
the fourth group and the fifth group each include at least one of the plurality of signal lines, and the fourth group and the fifth group transmit a signal of a constant polarity.

16. The display device of claim 15, wherein
the signal line included in the fourth group transmits a constant voltage having negative polarity, and
the signal line included in the fifth group transmits a constant voltage having positive polarity.

17. The display device of claim 16, wherein
the display panel further includes a second peripheral area and a third peripheral area that are each connected to the first peripheral area and are adjacent to the display area, and a fourth peripheral area that is connected to both the second peripheral area and the third peripheral area and is adjacent to the display area,
the first peripheral area and the fourth peripheral area are opposite each other with respect to the display area,
the second peripheral area and the third peripheral area are opposite each other with respect to the display area, and
the signal line included in the fourth group includes portions disposed in the second peripheral area, the third peripheral area, and the fourth peripheral area.

18. The display device of claim 16, wherein
the signal line included in the fifth group is connected to a driving voltage transmitting line disposed between the first peripheral area and the display area, and
the display area includes a plurality of driving voltage lines connected to the driving voltage transmitting line.

19. A display device comprising:
a display panel that includes a display area including a plurality of pixels and a first peripheral area adjacent to the display area,
wherein:
the first peripheral area includes a bendable region, a plurality of pads, and a plurality of signal lines partially included in the bendable region and respectively connected to the plurality of pads, the bendable region extending from a first edge of the display panel to a second edge of the display panel opposing the first edge,
the plurality of signal lines extend in a direction different from an extension direction of the bendable region,
the plurality of signal lines includes a data signal line group for transmitting data signals, and a first group, a second group, and a third group that are disposed between an edge of the bendable region and the data signal line group and are adjacent to each other in the bendable region,
the data signal line group, the first group, the second group, and the third group each include at least two of the plurality of signal lines, the at least two signal lines in each of the first group, the second group, and the third group not electrically connected to each other in the entire first peripheral area,
the signal lines included in the first group transmit a signal of positive polarity,
the signal lines included in the second group transmit a signal of negative polarity,
the signal lines included in the third group transmit a clock signal having a polarity that varies according to time,
one group among the first group, the second group, and the third group includes a signal line among the plurality of signal lines disposed at an edge of the bendable region,
the first group and the second group are separated by a first interval in the bendable region, and adjacent signal lines within the first group are separated by a second interval in the bendable region,
adjacent signal lines within the third group are separated by a third interval in the bendable region,
the third interval is greater than the second interval, and
the display area and the bendable region commonly include a same substrate as each other.

20. The display device of claim 19, wherein
the first group includes two or more adjacent signal lines among the plurality of signal lines, and
the first interval is greater than the second interval.

21. A display device comprising:
a display panel that includes a display area including a plurality of pixels and a first peripheral area adjacent to the display area,
wherein:
the first peripheral area includes a bendable region and a plurality of signal pads, the bendable region extending from a first edge of the display panel to a second edge of the display panel opposing the first edge,
the plurality of signal pads are connected to a plurality of electrical nodes in the display area by a plurality of signal lines through the bendable region, the plurality of signal lines in the bendable region being respectively connected to the plurality of signal pads,
the plurality of signal lines comprise a first group of first signal lines disposed adjacent to each other and configured to transmit signals of a first polarity, and a second group of second signal lines disposed adjacent to each other and configured to transmit signals of a second polarity, the second polarity being different from the first polarity,
the first signal lines are not electrically connected to each other in the entire first peripheral area,
the second signal lines are not electrically connected to each other in the entire first peripheral area,
adjacent signal lines of the first signal lines of the first group are separated from each other by a first interval in the bendable region, adjacent signal lines of the second signal lines of the second group are separated from each other by a second interval in the bendable region, and the first group is separated from the second group by a third interval in the bendable region,
the third interval is greater than the first interval or the second interval, and
the display area and the bendable region commonly include a same substrate as each other.

22. The display device of claim 21, wherein the plurality of signal lines further includes a third group of third signal lines disposed adjacent to each other and configured to transmit signals at varying polarities depending on time, the third signal lines of the third group are separated from each other by a fourth interval, the fourth interval is greater than the first interval or the second interval.

23. The display device of claim 22, wherein
the plurality of signal lines further comprise a data signal line group for transmitting data signals, a fourth group of fourth signal lines, and a fifth group of fifth signal lines,
the first group, the second group, the third group, the fourth group, and the fifth group are disposed sequentially in that order from an edge of the bendable region to the data signal line group and are adjacent to one another in the bendable region,
the data signal line group is disposed substantially at a central portion of the bendable region along an extension direction of the bendable region, the fifth signal lines transmit signals at the first polarity, the fourth signal lines transmit signals at the second polarity, the second group and the third group are separated by a fifth interval, the third group and the data signal line group are separated by a sixth interval, the fifth interval and the sixth interval are greater than the first interval, the second interval, and the fourth interval, the fourth signal lines in the fourth group and the fifth signal lines in the fifth group are separated from each other by a seventh interval and an eight interval, respectively, the fourth group and the fifth group are separated by a ninth interval, and the seventh interval and the eight interval are smaller than the ninth interval.

24. The display device of claim 23, wherein the display panel further includes a second peripheral area and a third peripheral area that are each connected to the first peripheral area and are adjacent to the display area, and a fourth peripheral area that is connected to both the second peripheral area and the third peripheral area and is adjacent to the display area, the first peripheral area and the fourth peripheral area are opposite each other with respect to the display area, the second peripheral area and the third peripheral area are opposite each other with respect to the display area, the fourth signal lines of the fourth group extend out of the first peripheral area and along the second peripheral area, the fourth peripheral area, and the third peripheral area to substantially surround the display area, and the fifth signal lines of the fifth group extend out of the bendable region towards the display area to connect to a driving voltage transmitting line extending along an edge of the display area adjacent to the first peripheral area.

25. The display device of claim 22, wherein the display panel further includes a second peripheral area and a third peripheral area that are each connected to the first peripheral area and are adjacent to the display area, a fourth peripheral area that is connected to both the second peripheral area and the third peripheral area and is adjacent to the display area, and a data input circuit portion disposed between the bendable region and the display area, the first peripheral area and the fourth peripheral area are opposite each other with respect to the display area, the second peripheral area and the third peripheral area are opposite each other with respect to the display area, a portion of the third signal lines of the third group extend out of the first peripheral area and along the second peripheral area, and a portion of the third signal lines of the third group extend out of the bendable region to partially surround the data input circuit portion.

26. The display device of claim 22, wherein two or more signal lines, among the plurality of signal lines, adjacent to each other and disposed at an edge of at least one group among the first group, the second group, and the third group are connected to one another.

27. The display device of claim 21, wherein the bendable region includes an organic insulating material.

28. The display device of claim 21, wherein the display panel further includes a second peripheral area and a third peripheral area that are each connected to the first peripheral area and are adjacent to the display area, and a fourth peripheral area that is connected to both the second peripheral area and the third peripheral area and is adjacent to the display area, the first peripheral area and the fourth peripheral area are opposite each other with respect to the display area, the second peripheral area and the third peripheral area are opposite each other with respect to the display area, and the first signal lines of the first group and the second signal lines of the second group extend out of the first peripheral area and along the second peripheral area, the fourth peripheral area, and the third peripheral area to substantially surround the display area.

* * * * *